(12) United States Patent
Horiguchi et al.

(10) Patent No.: US 7,459,753 B2
(45) Date of Patent: Dec. 2, 2008

(54) ELECTRO-OPTICAL DEVICE, METHOD FOR MANUFACTURING ELECTRO-OPTICAL DEVICE, AND ELECTRONIC APPARATUS

(75) Inventors: Masahiro Horiguchi, Tottori-ken (JP); Hideki Kaneko, Tottori-ken (JP)

(73) Assignee: Epson Imaging Devices Corporation, Nagano (JP)

( * ) Notice: Subject to any disclaimer, the term of this patent is extended or adjusted under 35 U.S.C. 154(b) by 0 days.

(21) Appl. No.: 11/741,180

(22) Filed: Apr. 27, 2007

(65) Prior Publication Data

US 2008/0042137 A1    Feb. 21, 2008

(30) Foreign Application Priority Data

Jul. 6, 2006    (JP) .............................. 2006-186365

(51) Int. Cl.
*H01L 27/01* (2006.01)
*H01L 27/12* (2006.01)
*H01L 31/0392* (2006.01)

(52) U.S. Cl. ........................... 257/350; 257/59; 257/72; 257/E29.151; 438/152

(58) Field of Classification Search .................. 257/59, 257/72, 350, E29.151; 438/152
See application file for complete search history.

(56) References Cited

U.S. PATENT DOCUMENTS 6,610,997 B2 *    8/2003  Murade ........................ 257/72

2006/0249733 A1 *  11/2006  Yamazaki et al. .............. 257/72
2007/0007527 A1 *   1/2007  Koyama ....................... 257/59

FOREIGN PATENT DOCUMENTS

| JP | 2000-347206   | 12/2000 |
| JP | 2004-184741 A |  2/2004 |
| JP | 2005-017926 A |  1/2005 |

* cited by examiner

*Primary Examiner*—Ngan Ngo
(74) *Attorney, Agent, or Firm*—Lowe Hauptman Ham & Berner, LLP

(57) ABSTRACT

An electro-optical device includes a substrate having a display region; TFTs each including a first electrode in the display region, a first insulating layer on the first electrode, a second electrode on the first insulating layer, and a second insulating layer on the second electrode; and terminals each including a first metal on a protruding section extending from the display region, which is located at the same level and made of the same metal as the first electrode, a second metal which is located at the same level and made of the same metal as the second electrode, and which partly overlaps the first metal in plan view, and a portion of the first insulating layer. The first insulating layer separates the first and second metals and the first metal is electrically connected to the first electrode or the second metal is electrically connected to the second electrode.

12 Claims, 16 Drawing Sheets

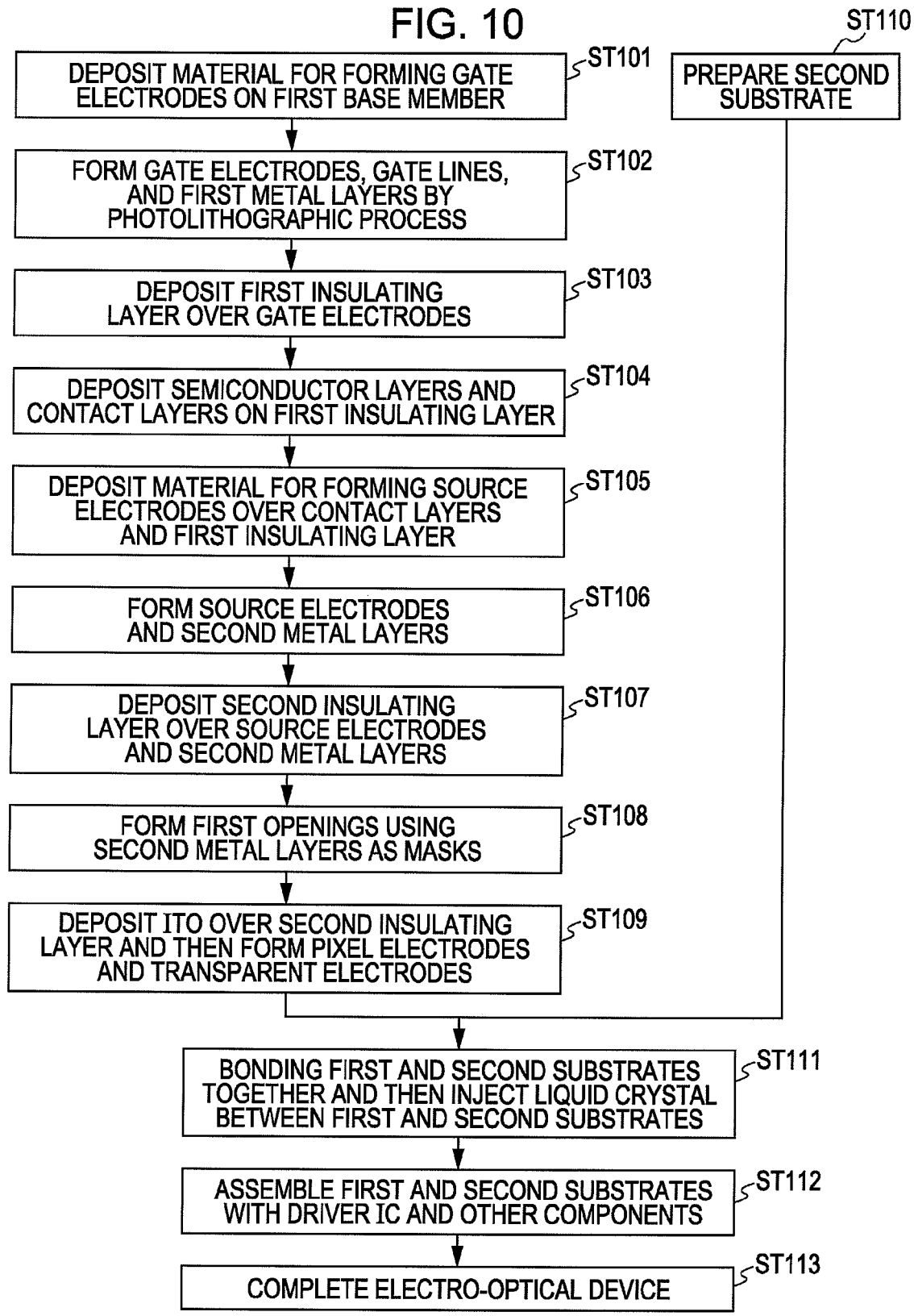

ELECTRO-OPTICAL DEVICE, METHOD FOR MANUFACTURING ELECTRO-OPTICAL DEVICE, AND ELECTRONIC APPARATUS

BACKGROUND

1. Technical Field

The present invention relates to an electro-optical device suitable for use in personal computers and mobile phones, a method for manufacturing the electro-optical device, and an electronic apparatus including the electro-optical device.

2. Related Art

Electro-optical devices such as liquid crystal devices have been used for displays for electronic apparatuses such as personal computers and mobile phones. The liquid crystal devices include semiconductor integrated circuit (IC) chips mounted on substrates by flip chip bonding.

In recent years, small-size high-performance electronic apparatuses have been demanded. Hence, the distance between wires, including terminals, extending on substrates needs to be small, that is, the pitch between the wires needs to be fine.

JP-A-2000-347206 (hereinafter referred to as Patent Document 1) discloses a liquid crystal display. The liquid crystal display includes a liquid crystal display element substrate including a plurality of input and output terminals arranged along an end portion thereof and also includes a driver IC, disposed on a surface of the liquid crystal display element substrate, including a plurality of input and output bumps. The driver IC is mounted on the liquid crystal display element substrate by flip chip bonding in such a manner that the input and output terminals are bonded to the input and output bumps, respectively, with an anisotropic conductive film disposed therebetween. The output bumps are narrow in the arrangement direction thereof; have a triangular, pentagonal, or trapezoidal shape; and are alternately arranged so as to form a first output bump array and a second output bump array. Portions of the output bumps in the second output bump array extend between the output bumps in the first output bump array. The terminals are geometrically similar to the bumps.

According to Patent Document 1, the driver IC, which is attached to a semiconductor IC chip, has a reduced size and the output bumps adjacent to each other are prevented from being electrically shorted. In the liquid crystal display, thin-film transistors are used as display element switches and the substrate has connection terminals electrically connected to gate or source electrodes of the thin-film transistors. Since the elevation from the substrate to the connection terminals connected to the gate electrodes is different from the elevation from the substrate to the connection terminals connected to the source electrodes, there is a problem in that the reliability of the electrical connection of the output bumps to the connection terminals connected to the gate electrodes is low.

In order to improve the reliability of the electrical connection, wires extending from the gate electrodes may be connected to metal interconnects arranged at the same level of the source electrodes such that the elevation from the substrate to the connection terminals connected to the gate electrodes is substantially equal to the elevation from the substrate to the connection terminals connected to the source electrodes. This can solve the above problem. However, the use of such interconnects causes problems that additional wires are required, the pitch between the connection terminals needs to be reduced, and the resistance of the liquid crystal display is increased although the liquid crystal display needs to have a reduced resistance. The use of the interconnects further causes a problem that the size of the driver IC cannot be reduced because the interconnects occupy a large area in the arrangement direction thereof.

SUMMARY

An advantage of an aspect of the invention is to provide an electro-optical device in which wires an connection terminals are arranged at a fine pitch and the connection terminals have high electrical reliability. An advantage of another aspect of the invention is to provide a method for manufacturing the electro-optical device. An advantage of another aspect of the invention is to provide an electronic apparatus including the electro-optical device.

The present invention provides an electro-optical device. The electro-optical device includes a substrate having a display region; a plurality of display thin-film transistors each including a first electrode disposed in the display region, a portion of a first insulating layer located on the side opposite to the substrate with the first electrode disposed therebetween, a second electrode located on the side opposite to the substrate with the first insulating layer disposed therebetween, and a second insulating layer located on the side opposite to the substrate with the second electrode disposed therebetween; and a plurality of connection terminals each including a first metal layer which is disposed on a protruding section extending from the display region, which is located at the same level as that of the first electrode, and which is made of the same metal as that of the first electrode, a second metal layer which is located at the same level as that of the second electrode, and which is made of the same metal as that of the second electrode, and which partly overlaps with the first metal layer in plan view, and a portion of the first insulating layer. The first insulating layer extends between the first and second metal layers and the first metal layer is electrically connected to the first electrode or the second metal layer is electrically connected to the second electrode. The term "substrate" used herein means, but is not limited to, a glass substrate. The term "display thin-film transistor" used herein means, but is not limited to, an amorphous silicon thin-film transistor (a-Si TFT) or a polysilicon thin-film transistor (p-Si TFT). The term "semiconductor integrated circuit (IC) chip" used herein means, but is not limited to, a driver IC.

Since the first metal layer partly overlaps with the second metal layer in plan view, the elevation from the substrate to a region where the first and second metal layers overlap is uniform. This improves the reliability of the electrical connection of the connection terminals to bumps of semiconductor IC chips.

In conventional techniques, the elevation from substrates to output connection terminals electrically connected to gate electrodes of TFTs is less than that from the substrates to input connection terminals electrically connected to source electrodes of the TFTs and therefore the electrical connection of the output and input connection terminals to bumps of semiconductor IC chips is insufficient. However, according to the present invention, since the first metal layer partly overlaps with the second metal layer in plan view, the elevation from the substrate to the connection terminals electrically connected to gate electrodes is substantially equal to that from the substrate to the connection terminals electrically connected to source electrodes, the connection terminals being electrically connected to bumps of a semiconductor IC chip.

Unlike conventional devices, the electro-optical device requires no interconnects because the first and second metal layers overlap with each other in the connection terminals.

This leads to a reduction in wiring resistance and enables the size reduction of semiconductor IC chips.

In the electro-optical device, the connection terminals may each further include a transparent electrode located on the side opposite to the substrate with the second metal layer disposed therebetween and the transparent electrode may be electrically connected to at least one of the first and second metal layers. This allows the first metal layer, which is lowermost, to be readily electrically connected to the transparent electrode, which is uppermost. The transparent electrodes can be electrically connected to bumps of semiconductor IC chips in such a state that the elevation from the substrate to the connection terminals electrically connected to gate electrodes is substantially equal to that from the substrate to the connection terminals electrically connected to source electrodes.

The transparent electrodes, which are lowermost, may be electrically connected to the second metal layers only. In this case, the first metal layers may be entirely covered with the first insulating layer and the first insulating layer need not have any hollow regions. This reduces the number of manufacturing steps to reduce manufacturing cost.

In the electro-optical device, the connection terminals may each have a contact section in which a portion of the first metal layer that is exposed from the first insulating layer is electrically connected to the second metal layer with the transparent electrode. This allows the first metal layer, which is lowermost, to be readily electrically connected to the transparent electrode, which is uppermost and also allows the elevation from the substrate to the top of the connection terminals electrically connected to gate electrodes to be substantially equal to that from the substrate to the top of the connection terminals electrically connected to source electrodes. Therefore, the connection terminals have high electric reliability.

In the electro-optical device, the contact section may have a hollow zone having a first hollow region through which the first metal layer is exposed and a second hollow region through which the second metal layer overlying the first metal layer and the first insulating layer is exposed and the transparent electrode may extend over the hollow zone. This allows the first and second metal layers to be efficiently electrically connected to each other with the transparent electrode through the first and second hollow regions.

The first and second metal layers can be electrically connected to each other with the transparent electrode at the shortest distance by connecting the first and second hollow regions together. This leads to a reduction in resistance.

In the electro-optical device, the contact section may be disposed in an end portion of each connection terminal that is located in the longitudinal direction of the connection terminal. This allows the connection terminals to have a reduced width and to be arranged at a reduced pitch.

If the contact sections are each located in both end portions of the connection terminal, the contact area between each first metal layer and transparent electrode is large. This leads to an increase in connection reliability.

If one of the contact sections each located in both end portions thereof is electrically broken, the other one is still usable. This also leads to an increase in connection reliability.

In the electro-optical device, the end portion of each connection terminal that is located in the longitudinal direction thereof is located on the leading side of the first or second metal layer. This allows a portion of the first metal layer that is located on the leading side thereof to be electrically connected to the second metal layer or the transparent electrode to reduce the resistance of the electrical connection of the connection terminals to the bumps of semiconductor IC chips. This leads to an increase in connection reliability.

The electro-optical device may further include a semiconductor integrated circuit chip which is mounted on the protruding section and which includes a plurality of output bumps arranged on a mount surface of the semiconductor integrated circuit chip. The output bumps may each have an end surface facing the transparent electrode and the end surface of each output bump may be partly in contact with an overlapping region where the first metal layer overlaps with the second metal layer in plan view. This allows the connection terminals to have uniform height to improve the electrical connection of the connection terminals to the bumps. Unlike conventional devices, the electro-optical device requires no interconnects for gate electrode wires. This allows the connection terminals ad wires to be arranged at a reduced pitch and also allows the electro-optical device to have a reduced size.

In the electro-optical device, the overlapping region may have a flat face, each contact section may have a flat face parallel to that of the overlapping region, and the flat face of the overlapping region may have an area greater than that of the flat face of the contact section. This improves the reliability of the electrical connection of the connection terminals and allows the connection terminals to have a reduced size.

In the electro-optical device, the flat face of the overlapping region has an area that is half or more of the area of the end surface of each output bump. Therefore, the output bump can be securely attached to the overlapping region. This improves the reliability of the electrical connection of the connection terminals and allows the connection terminals to have a reduced size.

The present invention provides a method for manufacturing an electro-optical device including a substrate having a display region. The method includes forming a plurality of display thin-film transistors and a plurality of connection terminals, the display thin-film transistors each including a first electrode disposed in the display region, a portion of a first insulating layer located on the side opposite to the substrate with the first electrode disposed therebetween, a second electrode located on the side opposite to the substrate with the first insulating layer disposed therebetween, and a second insulating layer located on the side opposite to the substrate with the second electrode disposed therebetween, the connection terminals each including a first metal layer which is disposed on a protruding section extending from the display region, which is located at the same level as that of the first electrode, and which is made of the same metal as that of the first electrode, a second metal layer which is located at the same level as that of the second electrode, and which is made of the same metal as that of the second electrode, and which partly overlaps with the first metal layer in plan view, and a portion of the first insulating layer. The method also includes mounting a semiconductor integrated circuit chip, including a plurality of output bumps each electrically connected to the corresponding connection terminals, on the protruding section. The first insulating layer extends between the first and second metal layers.

In the method, since the first metal layer partly overlaps with the second metal layer in plan view, the height of an overlapping region where the first and second metal layers overlap with each other from the substrate is uniform. This improves the reliability of the electrical connection the connection terminals to the bumps and allows the electro-optical device to be readily manufactured.

Unlike conventional devices, the electro-optical device requires no interconnects because the first and second metal layers overlap with each other in the connection terminals. This leads to a reduction in wiring resistance and allows the electro-optical device to be readily manufactured such that the semiconductor IC chip has a reduced size.

In the method, the connection terminals may be formed in such a manner that the second metal layers are formed by pattering and the first metal layers are exposed using the second metal layers as masks, developed, and then etched. This reduces the number of manufacturing steps to reduce manufacturing cost. In the case where the second metal layers have openings formed by patterning, when the second insulating layer overlying the second metal layers is exposed and then developed so as to have second hollow regions, first hollow regions connected to the second hollow regions can be formed in the first insulating layer. In this operation, the second metal layers can be used as masks and therefore precise exposure and development can be performed. This leads to a reduction in manufacturing cost.

The present invention provides an electronic apparatus including any one of the above electro-optical devices.

Since the electronic apparatus includes one of the electro-optical devices, in which the connection terminals and wires are arranged at a reduced pitch and the connection terminals have high electric reliability, the electronic apparatus has high reliability and can be manufactured at low cost so as to have a reduced size.

BRIEF DESCRIPTION OF THE DRAWINGS

The invention will be described with reference to the accompanying drawings, wherein like numbers reference like elements.

FIG. 10 is a flowchart illustrating a method for manufacturing the electro-optical device according to the first embodiment.

DESCRIPTION OF EXEMPLARY EMBODIMENTS

Embodiments of the present invention will now be described with reference to the accompanying drawings. Examples of electro-optical devices according to the embodiments include active-matrix liquid crystal devices including thin-film transistors (TFTs). The present invention is not limited to the active-matrix liquid crystal devices or electronic apparatus including the active-matrix liquid crystal devices. For the sake of clarity in the accompanying drawings, the scale and number of members are different from those of actual ones.

First Embodiment

Figure 1:
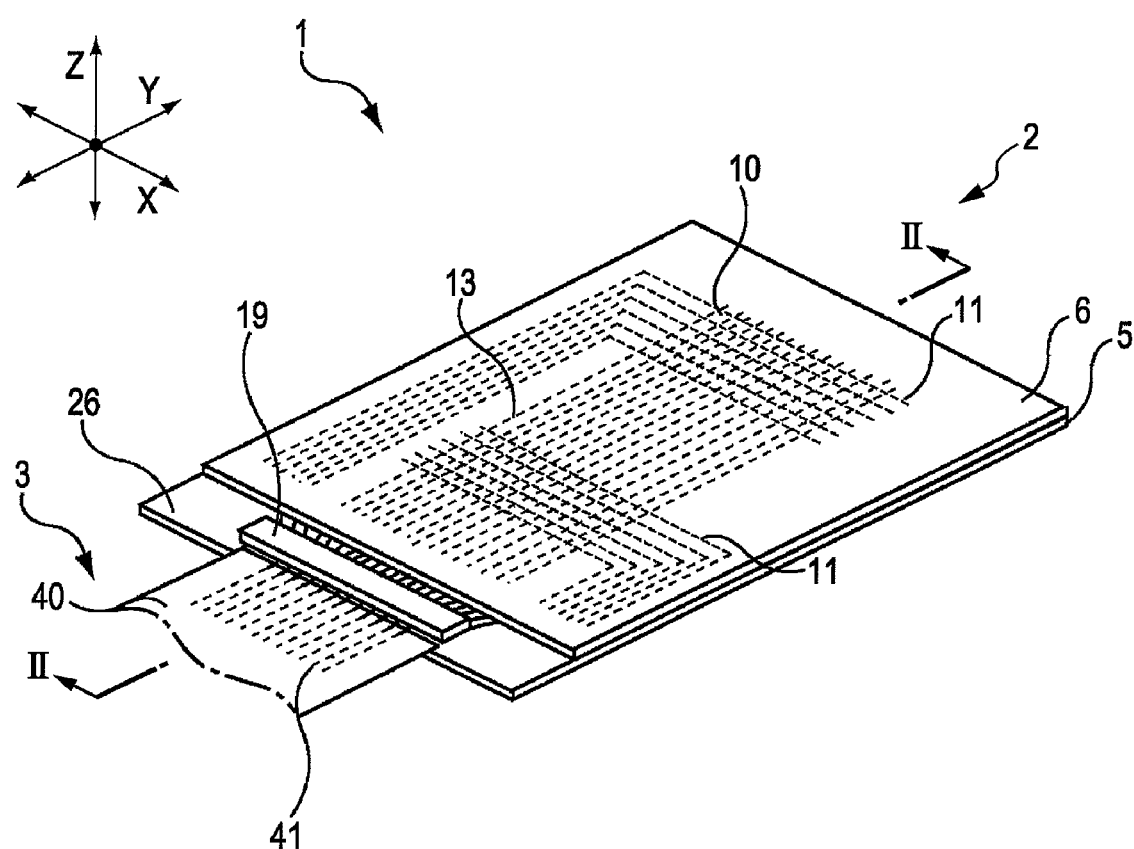
FIG. 1 is a schematic perspective view of an electro-optical device according to a first embodiment of the present invention.
Figure 2:
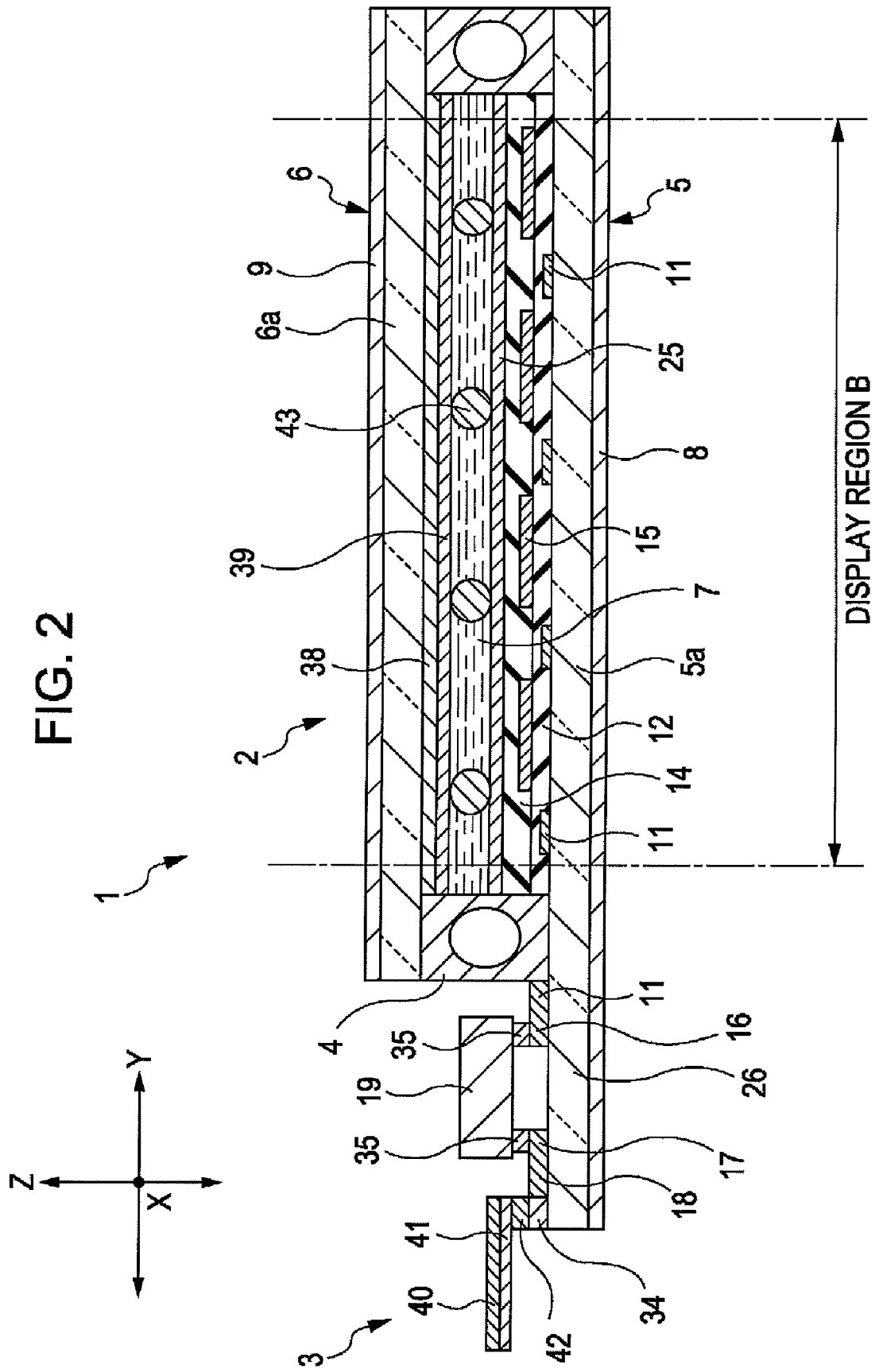
FIG. 2 is sectional view of the electro-optical device taken along the line II-II of FIG. 1.

FIG. 1 shows an electro-optical device 1 according to a first embodiment of the present invention in perspective view. FIG. 2 shows the electro-optical device in sectional view taken along the line II-II of FIG. 1.

With reference to FIG. 1, the electro-optical device 1 includes a liquid crystal panel 2 and a flexible board 3 electrically connected to the liquid crystal panel 2. The electro-optical device 1 may further include a lighting unit such as a backlight and ancillary components, which are not shown, as required.

With reference to FIG. 2, the liquid crystal panel 2 includes a sealing member 4, a first substrate 5, a second substrate 6 bonded to the first substrate 5 with the sealing member 4 disposed therebetween, and a twisted nematic (TN) liquid crystal 7 disposed between the first and second substrates 5 and 6 in a sealed manner.

The first and second substrates 5 and 6 include a first base member 5*a* and a second base member 6*a*, respectively. The first and second base members 5*a* and 6*a* are tabular and are made of a transparent material such as glass. With reference to FIG. 2, a first polarizing film 8 for polarizing incident light is located on the outer side (the side opposite to the liquid crystal 7) of the first base member 5*a* and a second polarizing film 9 for polarizing incident light is located on the outer side (the side opposite to the liquid crystal 7) of the second base member 6a.

With reference to FIGS. 1 and 2, the first substrate 5 includes a plurality of TFTs 10 which may be referred to as display thin-film transistors, a plurality of gate lines 11, a first insulating layer 12, a plurality of source lines 13, a second insulating layer 14, a plurality of pixel electrodes 15, a plurality of output connection terminals 16, a plurality of input connection terminals 17, input wires 18, and a driver IC 19 for driving the liquid crystal 7. The output and input connection terminals 16 and 17 may be collectively referred to as connection terminals.

Figure 3:
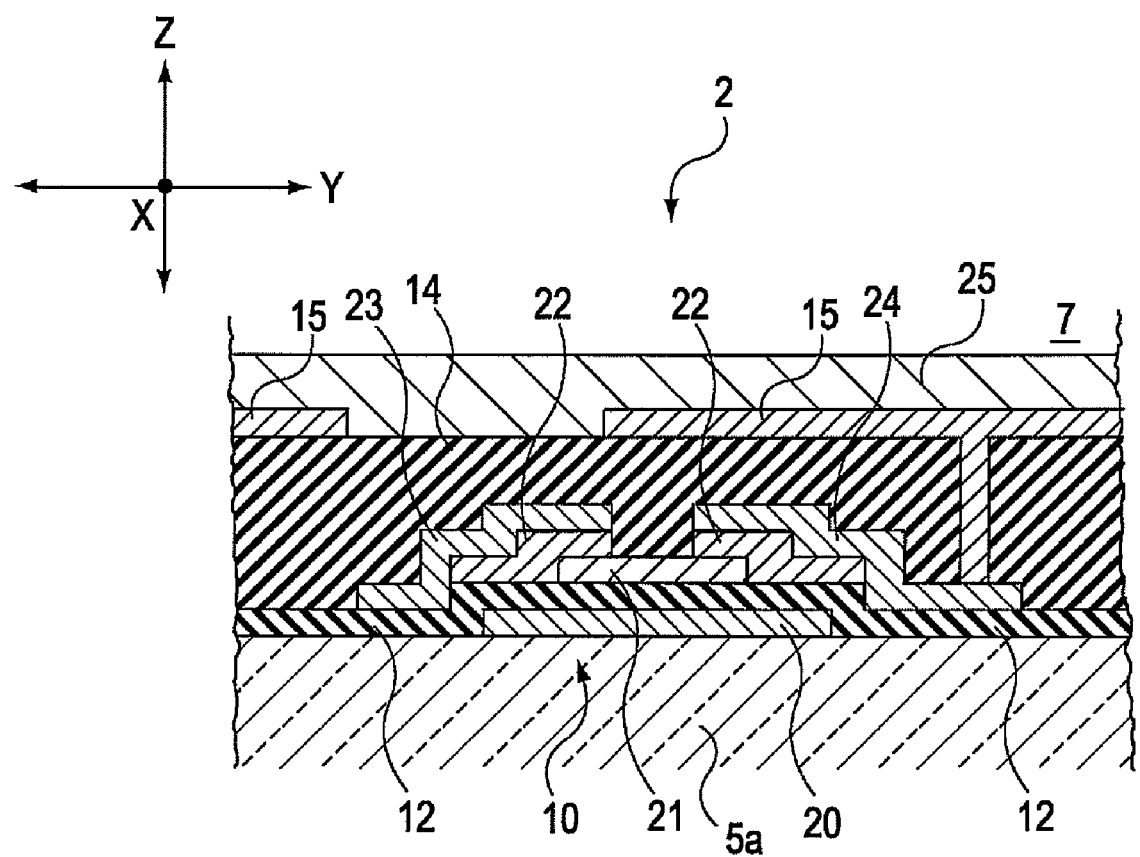
FIG. 3 is schematic sectional view of a TFT disposed in the electro-optical device according to the first embodiment.

With reference to FIG. 1, the TFTs 10 are located near intersections of the gate and source lines 11 and 13. FIG. 3 shows one of the TFTs 10 in sectional view. The TFTs 10 each include a gate electrode 20 which may referred to as a first electrode, a portion of the first insulating layer 12, a semiconductor layer 21, contact layers 22, a source electrode 23 which may referred to as a second electrode, a drain electrode 24, and a portion of the second insulating layer 14.

With reference to FIG. 2, the first substrate 5 has a display region B. The gate electrode 20 is disposed in the display region B so as to be located on the inner side (the liquid crystal side) of the first substrate 5. The first insulating layer 12 is located on the side (the liquid crystal side) opposite to the first base member 5a with the gate electrode 20 disposed therebetween so as to cover the gate electrode 20.

The semiconductor layer 21 is located above the gate electrode 20 with the first insulating layer 12 disposed therebetween. The source electrode 23 is located on the side opposite to the first base member 5a with the first insulating layer 12 disposed therebetween, that is, the source electrode 23 is located on one side of the semiconductor layer 21 with one of the contact layers 22 disposed therebetween.

The drain electrode 24 is located on the other side of the semiconductor layer 21 with the other one of the contact layers 22 disposed therebetween. The second insulating layer 14 is located on the side opposite to the first base member 5a so as to cover the drain electrodes 24 and the source electrodes 23.

The gate lines 11 extend in parallel to each other in the X direction in FIG. 1 and are arranged on the inner side (the liquid crystal side) of the first base member 5a as shown in FIGS. 1, 2, and 3. One end of each gate line 11 is electrically connected to each gate electrode 20 and the other end is electrically connected to each output connection terminal 16.

The first insulating layer 12 covers the gate electrodes 20 as described above and extends substantially over the first base member 5a except regions described below.

The source lines 13 extend in parallel to each other in the Y direction in FIG. 1 to intersect with the gate lines 11 and are arranged on the inner side (the liquid crystal side) of the first insulating layer 12. One end of each source line 13 is electrically connected to each source electrode 23 and the other end is electrically connected to each output connection terminal 16.

The second insulating layer 14 covers the source electrodes 23 and the drain electrodes 24 as described above and extends substantially over the first substrate 5 except regions described below.

With reference to FIG. 3, the pixel electrodes 15 each cover a rectangular region (a pixel region) which is located on the inner side of the second insulating layer 14 and which is defined by the gate and source lines 11 and 13 intersecting with each other except a subregion of the rectangular region that corresponds to one of the TFTs 10. The pixel electrodes 15 are made of a transparent material such as indium tin oxide (ITO) and are electrically connected to the drain electrodes 24 as shown in FIG. 3.

This allows currents to be supplied from the source electrodes 23 to the pixel electrodes 15 when voltages are applied to the gate electrodes 20. The source electrodes 23 apply data signals to the pixel electrodes 15, which apply voltages to the liquid crystal 7.

A first alignment layer 25 is located on the inner side (the liquid crystal side) of the pixel electrodes 15.

The gate lines 11 and the gate electrodes 20 are made of chromium, tantalum, or the like. The first insulating layer 12 is made of silicon nitride ($SiN_x$), silicon oxide ($SiO_x$), or the like. The source lines 13, the source electrodes 23, and the drain electrodes 24 are made of titanium, molybdenum, aluminum, or the like.

With reference to FIGS. 1 and 2, a protruding section 26 extends from the periphery of the second base member 6a and is overlaid with the output connection terminals 16, the input connection terminals 17, and the driver IC 19.

Figure 4:
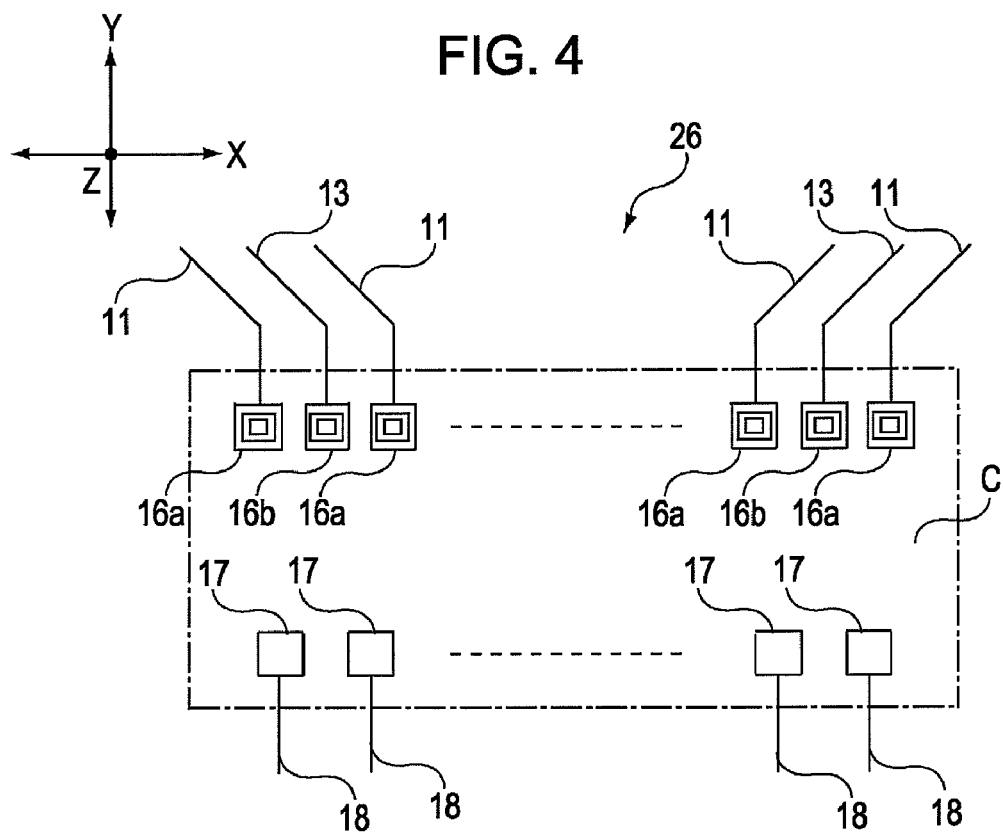
FIG. 4 is a partial plan view of a protruding section that is a portion of a first substrate disposed in the electro-optical device according to the first embodiment.

FIG. 4 shows the protruding section 26 in plan view. The protruding section 26 has a mount region C corresponding to a mount surface of the driver IC 19. The output connection terminals 16 and the input connection terminals 17 are arranged in the mount region C. The input connection terminals 17 are electrically connected to the input wires 18. The output connection terminals 16 are grouped into gate output connection terminals 16a and source output connection terminals 16b. The gate output connection terminals 16a and the source output connection terminals 16b are electrically connected to the gate lines 11 and the source lines 13, respectively.

With reference to FIG. 4, the mount region C has a rectangular shape and the gate and source output connection terminals 16a and 16b are alternately arranged in the mount region C so as to form a line along a long side of the mount region C that is close to the display region B. The arrangement of the gate and source output connection terminals 16a and 16b is not limited to that shown in FIG. 4. The gate and source output connection terminals 16a and 16b may be alternatively arranged in two lines or may be arranged along a short side of the mount region C in the vertical direction (the Y direction) in FIG. 4. The gate and source output connection terminals 16a and 16b need not be alternatively arranged and may be arranged in different regions.

Figure 5:
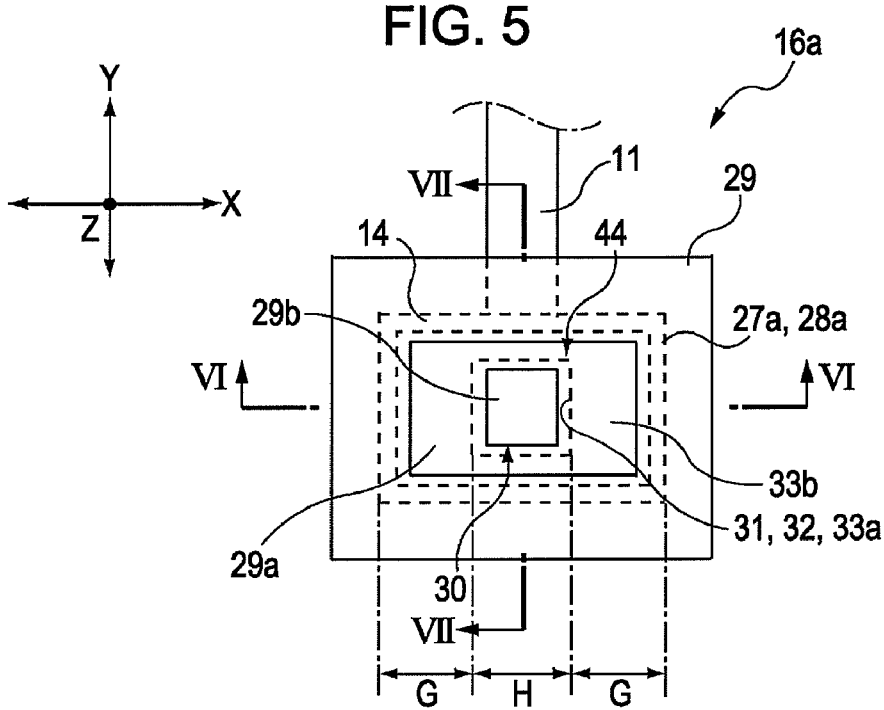
FIG. 5 is a plan view of a gate output connection terminal disposed in the electro-optical device according to the first embodiment.
Figure 6:
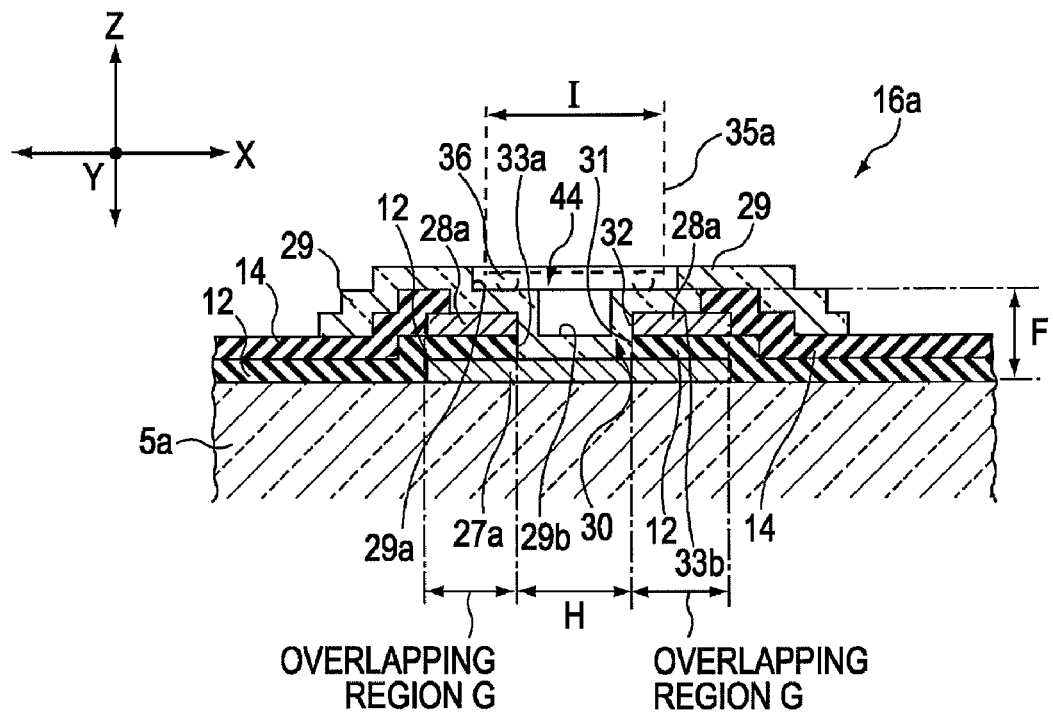
FIG. 6 is a sectional view of the gate output connection terminal taken along the line VI-VI of FIG. 5.
Figure 7:
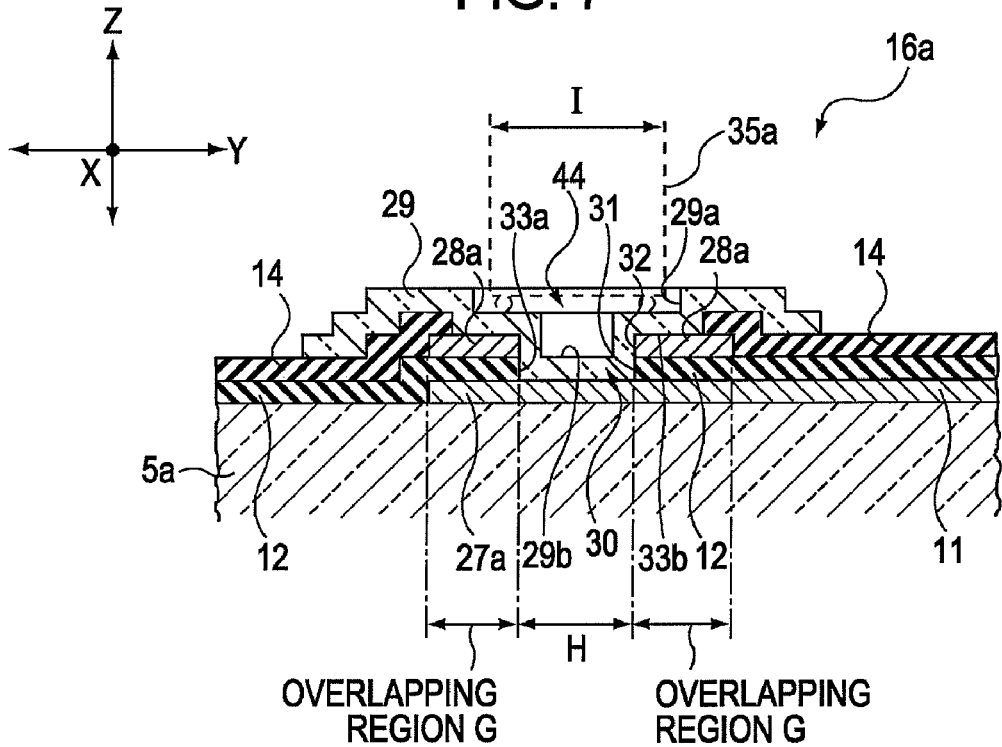
FIG. 7 is a sectional view of the gate output connection terminal taken along the line VII-VII of FIG. 5.
Figure 8:
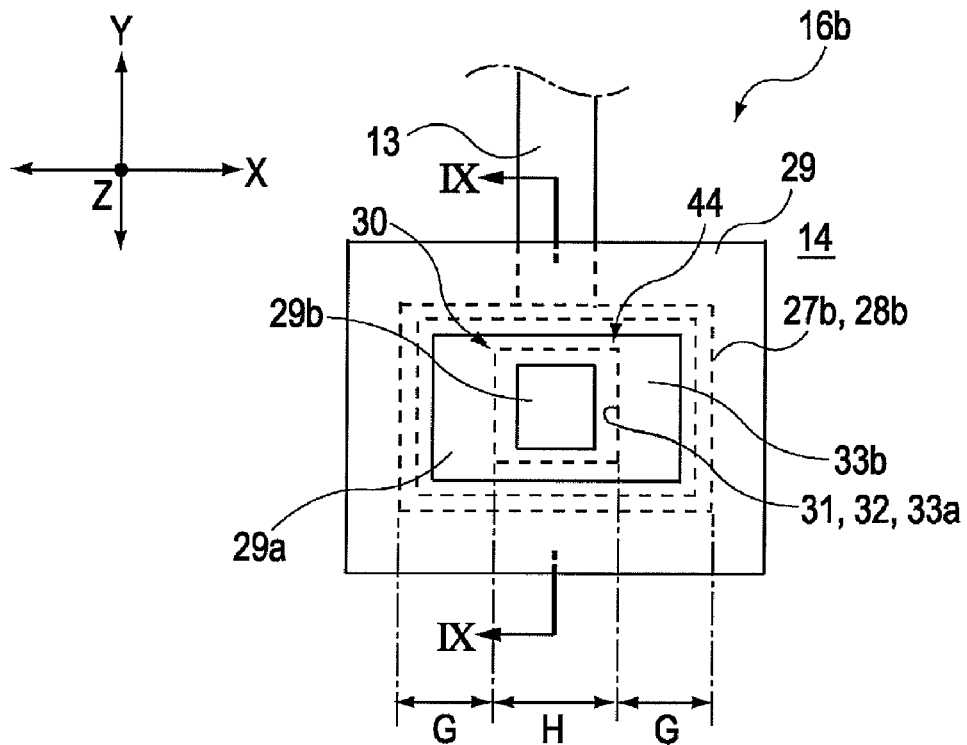
FIG. 8 is a plan view of a source output connection terminal disposed in the electro-optical device according to the first embodiment.
Figure 9:
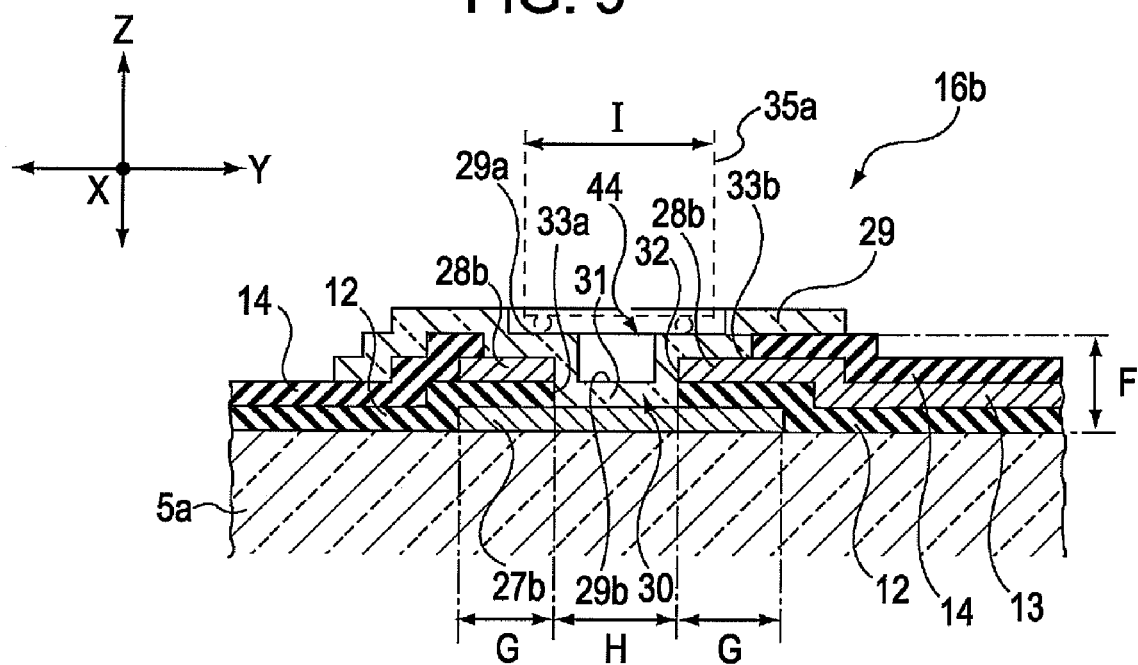
FIG. 9 is a sectional view of the source output connection terminals taken along the line IX-IX of FIG. 8.

FIG. 5 shows one of the gate output connection terminals 16a in plan view. FIG. 6 shows the gate output connection terminal 16a in sectional view taken along the line VI-VI of FIG. 5. FIG. 7 shows the gate output connection terminal 16a in sectional view taken along the line VII-VII of FIG. 5. With reference to FIGS. 5 to 7, the gate output connection terminals 16a each include a first gate metal layer 27a and a second gate metal layer 28a. FIG. 8 shows one of the source output connection terminals 16b in plan view. FIG. 9 shows the source output connection terminal 16b in sectional view taken along the line IX-IX of FIG. 8. With reference to FIGS. 8 and 9, the source output connection terminals 16b each include a first source metal layer 27b and a second source metal layer 28b. The first gate metal layer 27a and the first source metal layer 27b are made of the same metal as that of the gate electrodes 20 and are arranged at the same level as that of the gate electrodes 20. The second gate metal layer 28a and the second source metal layer 28b are made of the same material as that of the source electrodes 23 and are arranged at the same level as that of the source electrodes 23. The first gate metal layer 27a and the first source metal layer 27b may be collectively referred to as first metal layers 27 and the second gate metal layer 28*a* and the second source metal layer 28*b* may be collectively referred to as second metal layers 28.

The gate and source output connection terminals 16*a* and 16*b* each include a portion of the first insulating layer 12, which extends between each first metal layer 27 and second metal layer 28, a portion of the second insulating layer 14, which covers portions of the second metal layers 28, and a transparent electrode 29 for electrically connecting each first metal layer 27 to each second metal layer 28. The gate and source output connection terminals 16*a* and 16*b* each further include a contact section 30 in which the first metal layer 27 partly exposed from the first insulating layer 12 is electrically connected to the second metal layer 28 with the transparent electrode 29.

In particular, the first gate metal layer 27*a* has substantially a rectangular shape in plan view and is disposed on the first base member 5*a* so as to be located in the mount region C as shown in FIGS. 5, 6, and 7. The first gate metal layer 27*a* is connected to a rectangular end portion of each gate line 11 as shown in FIG. 5. With reference to FIG. 7, the gate line 11 (the gate electrode 20) and the first gate metal layer 27*a* are not separately shown because the gate line 11 and the first gate metal layer 27*a* are connected to each other and are made of the same metal.

The first insulating layer 12 overlies the first gate metal layers 27*a* and has first hollow regions 31 as shown in as shown in FIGS. 6 and 7. The first hollow regions 31 are each located on, for example, a center portion of each first gate metal layer 27*a*, have substantially a rectangular shape in sectional view, and are smaller than the first gate metal layers 27*a*. The first gate metal layers 27*a* are exposed through the first hollow regions 31.

In the gate output connection terminals 16*a*, the second gate metal layers 28*a* have substantially a rectangular shape and are arranged on the first insulating layer 12 so as to overlap with the first gate metal layers 27*a* in plan view as shown in FIGS. 6 and 7. The second gate metal layers 28*a* each have an opening 32 substantially overlapping with one of the first hollow regions 31 in plan view. That is, the second gate metal layers 28*a* have a frame shape.

That is, the second gate metal layers 28*a* entirely overlap with the first gate metal layers 27*a* in plan view with the first gate metal layers 27*a* sandwiched between the first base member 5*a* and the second gate metal layers 28*a* as shown in FIGS. 5, 6, and 7. The periphery of each opening 32 substantially agrees with that of each first hollow region 31.

The second insulating layer 14 overlies the first insulating layer 12 so as to cover outer end portions of the second gate metal layers 28*a* as shown in FIGS. 6 and 7. The second insulating layer 14 has second hollow regions 33*a* through which the second gate metal layers 28*a* and the openings 32 are exposed. The second gate metal layers 28*a* have exposed portions 33*b* exposed from the second insulating layer 14.

Each second hollow region 33*a* substantially overlaps with each first hollow region 31 as shown in FIGS. 6 and 7. The second hollow region 33*a* and the first hollow region 31 form a hollow zone 44.

In each gate output connection terminal 16*a*, the transparent electrode 29 extends over the hollow zone 44. In particular, the transparent electrode 29 extends on the second insulating layer 14 to cover the following portions: a portion of the first gate metal layer 27*a* that is exposed through the first and second hollow regions 31 and 33*a*, portions around the opening 32 of the second gate metal layer 28*a*, the exposed portion 33*b*, and portions around the exposed portion 33*b*.

This allows the contact section 30, in which the first gate metal layer 27*a* exposed from the first insulating layer 12 is electrically connected to the second gate metal layer 28*a* with the transparent electrode 29, to be located at substantially the center of each gate output connection terminal 16*a* such that the contact section 30 includes the hollow zone 44.

The driver IC 19 includes bump sections 35 having output bumps 35*a* each connected to a surface of each transparent electrode 29 with, for example, conductive particles 36. With reference to FIG. 6, the elevation from the upper surface of the first base member 5*a* to the surface of the transparent electrode 29 that is connected to the output bump 35*a* is equal to the sum of the thickness of the first gate metal layer 27*a*, that of the first insulating layer 12, that of the second gate metal layer 28*a*, and that of the second insulating layer 14, the sum of the thicknesses of these layers being represented by F.

With reference to FIGS. 6 and 7, the gate output connection terminals 16*a* each have an overlapping region G where the first gate metal layer 27*a* overlaps with the second gate metal layer 28*a* in plan view. The output bumps 35*a* each have an end surface facing the transparent electrode 29. The end surface of each output bump 35*a* overlaps with the overlapping region G.

With reference to FIGS. 6 and 7, the transparent electrode 29 has a first recess 29*a* disposed on the exposed portion 33*b* of the second gate metal layer 28*a* and also has a second recess 29*b* located in the bottom of the first recess 29*a*. The second recess 29*b* corresponds to the contact section 30.

With reference to FIGS. 6 and 7, the second gate metal layer 28*a*, which has a frame shape in plan view, is disposed above the first gate metal layer 27*a*, which has a rectangular shape in plan view, with the first insulating layer 12 disposed therebetween such that the periphery of the second gate metal layer 28*a* substantially agrees with that of the first gate metal layer 27*a*. In the overlapping region G, the second gate metal layer 28*a* overlaps with the first gate metal layer 27*a* in plan view except the opening 32.

The output bumps 35*a* extend into the first recesses 29*a* and are electrically connected to the transparent electrodes 29 with the conductive particles 36. With reference to FIG. 6, each output bump 35*a* is not in contact with the wall or bottom of each second recess 29*b* and the end surface of the output bump 35*a* overlaps with the overlapping region G in plan view.

The overlapping region G has a flat face parallel to the X-Y plane in FIG. 6 and the contact section 30, which corresponds to the second recess 29*b*, has a flat face parallel to the X-Y plane in FIG. 6. The flat face of the overlapping region G has an area greater than that of the flat face H of the contact section 30, the flat face of the contact section 30 being represented by H in FIGS. 6 and 7. That is, the overlapping region G is greater than a region where the first gate metal layer 27*a* does not overlap with the second gate metal layer 28*a* in plan view.

In the gate output connection terminal 16*a*, the flat face of the overlapping region G has an area that is half or more of the area of the end surface of the output bump 35*a*.

The first and second hollow regions 31 and 33*a* are rectangular as described above and may be circular in plan view. The number of the first and second hollow regions 31 and 33*a* present in the gate output connection terminal 16*a* is not limited to one. The shape of the second gate metal layer 28*a* is not limited to such a frame shape and the second gate metal layer 28*a* may have, for example, a donut shape or a ring shape.

The source output connection terminals 16*b* have substantially the same configuration as that of the gate output connection terminals 16*a*. However, the source output connection terminals 16*b* are connected to the source lines 13 although the gate output connection terminals 16a are connected to the gate lines 11. This is the difference between the source output connection terminals 16b and the gate output connection terminals 16a.

With reference to FIGS. 8 and 9, in each source output connection terminal 16b, the first source metal layer 27b has substantially a rectangular shape, is disposed on the first base member 5a so as to be located in the mount region C, and is not connected to any gate line 11.

The first insulating layer 12 extending over the first base member 5a covers the first source metal layer 27b and has first hollow regions 31 as shown in as shown in FIGS. 6 and 7. Each first hollow region 31 is located above, for example, a center portion of each first source metal layer 27b, has substantially a rectangular shape, and is smaller than the first source metal layer 27b. The first source metal layer 27b is exposed through the first hollow region 31.

The second source metal layer 28b overlaps with the first source metal layer 27b in plan view and has a rectangular shape. With reference to FIG. 8, the second source metal layer 28b has an upper side connected to each source line 13. With reference to FIG. 9, the second source metal layer 28b and the source line 13 (the source electrode 23) are not separately shown because the second source metal layer 28b and the source line 13 are made of the same material. The second source metal layer 28b has an opening 32 which is located at the center thereof and which overlaps with the first hollow region 31.

With reference to FIGS. 8 and 9, the second source metal layer 28b overlaps with the first source metal layer 27b in plan view with the first source metal layer 27b and the first insulating layer 12 sandwiched between the first base member 5a and the second source metal layer 28b and the periphery of the opening 32 substantially agrees with that of the first hollow region 31.

The second insulating layer 14 overlying the first insulating layer 12 covers an outer end portion of the second source metal layer 28b as shown in FIGS. 8 and 9. The second insulating layer 14 has second hollow regions 33a from which the second source metal layers 28b are exposed. The second source metal layers 28b each have an exposed portion 33b exposed from the second insulating layer 14.

In each source output connection terminal 16b, the transparent electrode 29 covers the hollow zone 44. In particular, the transparent electrode 29 covers a portion of the first source metal layer 27b that is exposed through the first and second hollow regions 31 and 33a, an inner end portion of the second source metal layer 28b, the exposed portions 33b, and regions around the exposed portion 33b.

This allows the contact section 30, in which the first source metal layer 27b partly exposed from the first insulating layer 12 is electrically connected to the second source metal layer 28b with the transparent electrode 29, to be located at substantially the center of the source output connection terminal 16b such that the contact section 30 includes the hollow zone 44.

With reference to FIG. 9, the elevation from the upper surface of the first base member 5a to the surface of the transparent electrode 29 that is connected to the output bump 35a is equal to the sum of the thickness of the first source metal layer 27b, that of the first insulating layer 12, that of the second source metal layer 28b, and that of the second insulating layer 14, the sum of the thicknesses of these layers being represented by F. Therefore, the height of the gate output connection terminals 16a is equal to that of the source output connection terminals 16b. This allows the height of the gate output connection terminal 16a from the first base member 5a to be equal to that of the source output connection terminal 16b from the first base member 5a, thereby improving the reliability of the electrical connection of the gate and source output connection terminals 16a and 16b to the output bumps 35a.

The first and second hollow regions 31 and 33a are rectangular as described above and may be circular in plan view. The number of the first and second hollow regions 31 and 33a present in the source output connection terminal 16b is not limited to one. The shape of the second source metal layer 28b is not limited to such a frame shape and the second source metal layer 28b may have, for example, a donut shape or a ring shape.

With reference to FIG. 2, the input wires 18 are electrically connected to external terminals 34.

The driver IC 19 includes the bump sections 35 as described above. With reference to FIG. 2, the bump sections 35 are mounted above the protruding section 26 and are electrically connected to the output connection terminals 16 and the input connection terminals 17 with the conductive particles 36. The conductive particles 36 have anisotropic conductive films 37 serving as adhesive members.

With reference to FIG. 2, the second substrate 6 includes a common electrode 38 located on the inner side (the liquid crystal side) of the second base member 6a and also includes a second alignment layer 39 located on the liquid crystal side of the common electrode 38.

Color layers, a light-shielding layer, and the like, which are not shown, are arranged on the liquid crystal side of the second substrate 6.

With reference to FIGS. 1 and 2, the flexible board 3 includes a third base member 40 and a wiring pattern 41 which is made of copper (Cu) and which is disposed on the third base member 40.

The third base member 40 is a flexible film. The wiring pattern 41 is electrically connected to a connection terminal, which is not shown, located at the protruding section-side end of the third base member 40. This connection terminal is electrically connected to an external terminal 34, attached to the liquid crystal panel 2, with an anisotropic conductive film 42.

A method for manufacturing the electro-optical device 1 will now be described with particular emphasis on the output connection terminals 16 on the protruding section 26.

FIG. 10 is a flowchart illustrating the method. FIGS. 11A to 11E are illustrations showing steps of a procedure for forming the second metal layers 28. FIGS. 12A to 12D are illustrations showing steps of a procedure for mounting the driver IC 19.

Figure 11A:
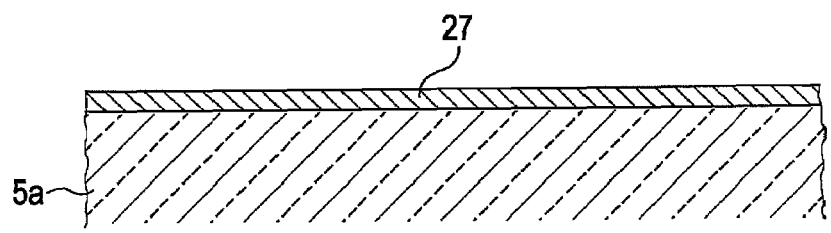
FIGS. 11A to 11E are illustrations showing steps of a procedure for forming second metal layers disposed in the electro-optical device according to the first embodiment.
Figure 11B:
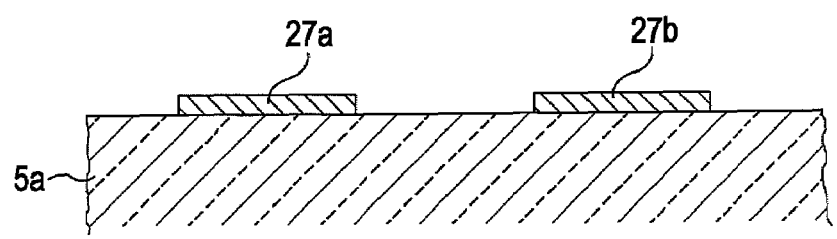

The method includes Steps ST101 to ST113 as shown in FIG. 10. In Step ST101, as shown in FIG. 11A, a layer of chromium or tantalum which is a material for forming the gate electrodes 20 is deposited on the first base member 5a so as to have a uniform thickness. In Step ST102, as shown in FIG. 11B, this layer patterned by a photolithographic process, whereby the gate lines 11, the gate electrodes 20, and the first metal layers 27 are formed. In this step, the first gate metal layers 27a, which are included in the gate output connection terminals 16a, are formed so as to be electrically connected to the gate lines 11 as shown in FIG. 5 and the first source metal layers 27b, which are included in the source output connection terminals 16b, are formed so as not to be electrically connected to the gate lines 11 and so as to have substantially a rectangular shape.

Figure 11C:
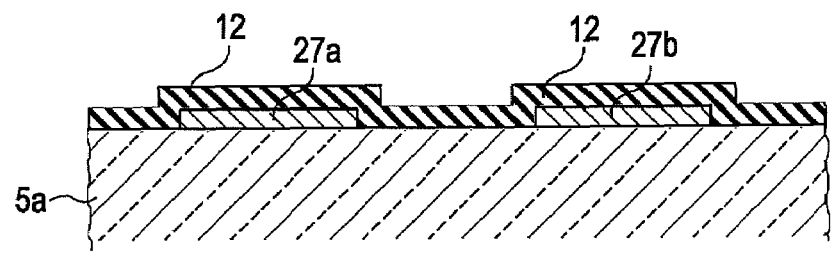

In Step ST103, as shown in FIG. 11C, the first insulating layer 12 made of silicon nitride is deposited over the gate lines 11, the gate electrodes 20, and the first metal layers 27 by, for example, a plasma-enhanced chemical vapor deposition (PECVD) process. In Step ST104, an amorphous silicon (a-Si) layer for forming the semiconductor layers 21 and an n+ a-Si layer for forming the contact layers 22 are continuously formed on the first insulating layer 12 in that order and then patterned, whereby the semiconductor layers 21 and the contact layers 22 are formed.

Figure 11D:
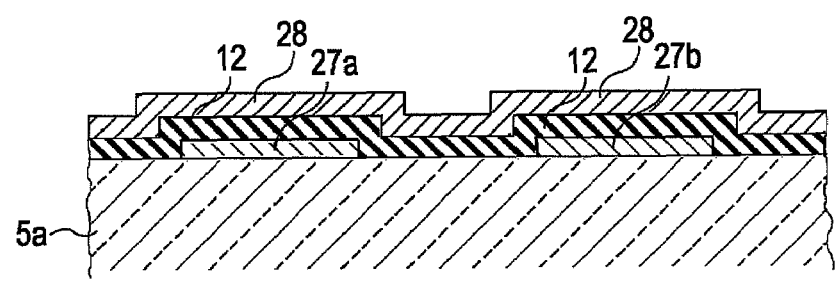
Figure 11E:
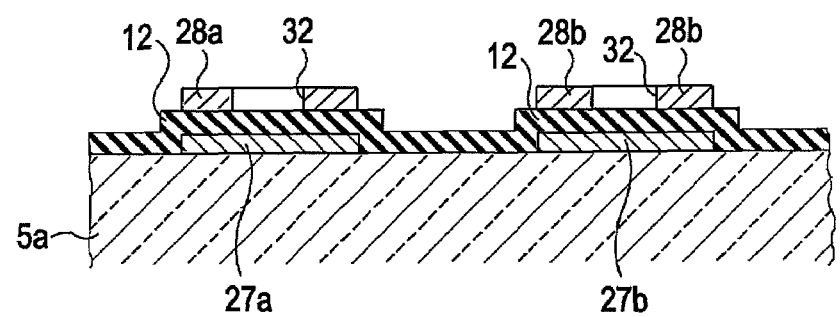

In Step ST105, as shown in FIG. 11D, a layer of titanium, molybdenum, aluminum, or the like is deposited over the semiconductor layers 21, the contact layers 22, and the first insulating layer 12 by a sputtering process. In Step ST106, as shown in FIG. 11E, this layer is patterned, whereby the source electrodes 23, the drain electrodes 24, the source lines 13, and the second metal layers 28 are formed. In this step, the second source metal layers 28b, which are included in the source output connection terminals 16b, are formed so as to be electrically connected to the source lines 13 as shown in FIG. 8 and the second gate metal layers 28a, which are included in the gate output connection terminals 16a, are formed so as not to be electrically connected to the source lines 13. The second gate metal layers 28a and the second source metal layers 28b have the openings 32 located at substantially the centers thereof and have a frame shape.

Figure 12A:
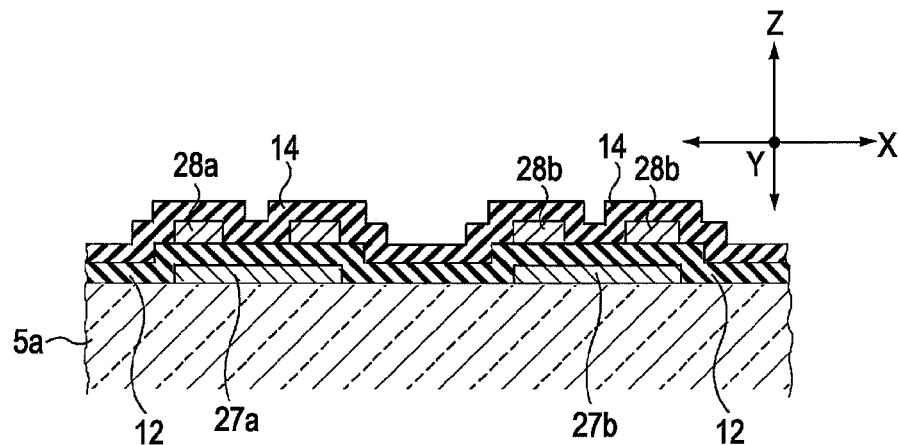
FIGS. 12A to 12D are illustrations showing steps of a procedure for mounting a driver IC disposed in the electro-optical device according to the first embodiment.

In Step ST107, as shown in FIG. 12A, the second insulating layer 14 is deposited over the source electrodes 23, the drain electrodes 24, the source lines 13, and the second metal layers 28.

Figure 12B:
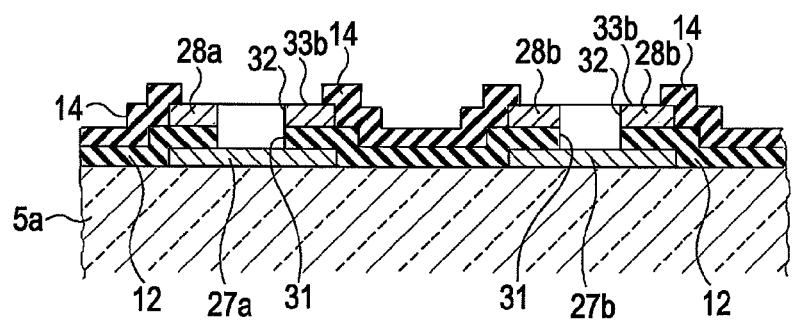

In Step ST108, as shown in FIG. 12B, the second insulating layer 14 is partly removed by a photolithographic process such that the second metal layers 28 are partly exposed and the bump sections 35 of the driver IC 19 can extend into removed portions of the second insulating layer 14, whereby the exposed portions 33b and the second hollow regions 33a are formed.

In this step, since the second metal layers 28 have the openings 32, the first insulating layer 12 partly exposed through the openings 32 is partly removed. That is, the first insulating layer 12 is exposed using the second metal layers 28 formed by patterning as exposure masks, developed, and then etched together with the second insulating layer 14, whereby the first hollow regions 31 are formed so as to overlap with the second hollow regions 33a and so as to have substantially the same shape as that of the second hollow regions 33a.

Figure 12C:
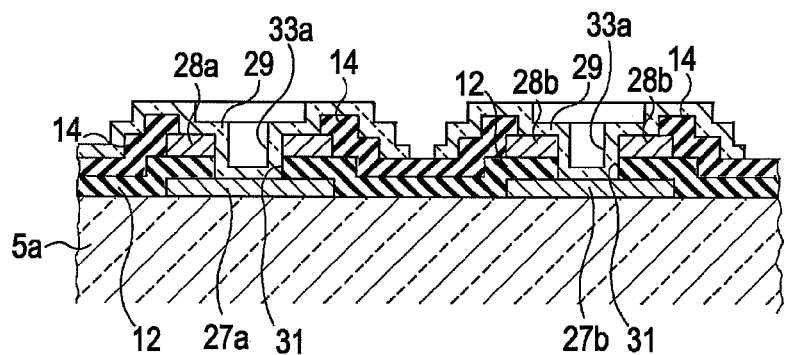

In Step ST109, as shown in FIG. 12C, a layer of ITO is deposited over the second insulating layer 14, the exposed portions 33b, the second metal layers 28 exposed through the second hollow regions 33a, and the first metal layers 27 exposed through the first hollow regions 31 and then patterned by a photolithographic process, whereby the pixel electrodes 15 and the transparent electrodes 29 are formed. This allows the first metal layers 27 to be electrically connected to the second metal layers 28 with the transparent electrodes 29 and also allows the contact sections 30 to be formed. Therefore, the contact sections 30 have the first hollow regions 31, which are present in the second insulating layer 14, and the second hollow regions 33a, which are present in the second insulating layer 14 and overlap with the first hollow regions 31. The input connection terminals 17 and the external terminal 34 may be formed together with the gate electrodes 20 and the source electrodes 23.

In Step ST110, a base layer, a reflective layer, and the color layers are formed on the liquid crystal side of the second base member 6a as required, the common electrode 38 are also formed on the liquid crystal side thereof, and the second alignment layer 39 is formed on the common electrode 38 and then rubbed, whereby the second substrate 6 is prepared.

In Step ST111, gap spacers 43 are provided on the first substrate 5 by a dry process, the first and second substrates 5 and 6 are then bonded to each other with the sealing member 4 disposed therebetween, the liquid crystal 7 is injected between the resulting first and second substrates 5 and 6 through an inlet (not shown) present in the sealing member 4, and the inlet is then sealed with a sealant such as a ultraviolet-curable resin, whereby the liquid crystal 7 is sealed between the first and second substrates 5 and 6.

Figure 12D:
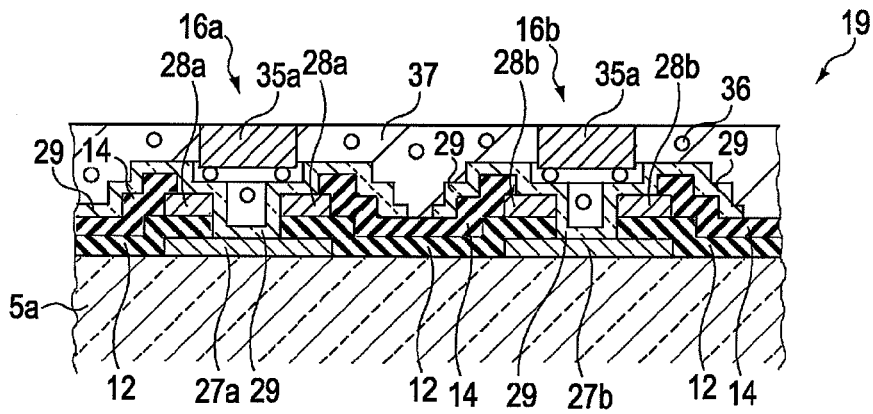

In Step ST112, as shown in FIG. 12D, the driver IC 19 is pressed against the mount region C of the protruding section 26 with a press head (not shown) at a predetermined pressure with the conductive particles 36 disposed between the driver IC 19 and the mount region C and then heated to about 300° C., whereby the driver IC 19 is mounted on the first substrate 5. The output bumps 35a of the driver IC 19 abut the gate output connection terminals 16a and the source output connection terminals 16b at the same elevation.

The wiring pattern 41, connection terminals, and the like are mounted on the third base member 40, whereby the flexible board 3 is prepared. The connection terminal electrically connected to the wiring pattern 41 is electrically connected to the external terminal 34 of the liquid crystal panel 2 with the anisotropic conductive film 42.

In Step ST113, the first and second polarizing films 8 and 9 are bonded to the outer surfaces of the first and second base members 5a and 6a, respectively, and the lighting unit is then attached to the liquid crystal panel 2 as required, whereby the electro-optical device 1 is obtained.

The method for manufacturing the electro-optical device 1 is as described above.

According to this embodiment, the output connection terminals 16 are formed such that the first and second metal layers 27 and 28, which are arranged at the same level as that of the gate electrodes 20 and source electrodes 23 of the TFTs 10 and are made of the same material of the gate electrodes 20 and the source electrodes 23, partly overlap with each other in plan view. Therefore, in the overlapping region G, the elevation from the upper surface of the first base member 5a is uniform. This enhances the reliability of the electrical connection of the driver IC 19 to the bump sections 35.

Since first and second metal layers 27 and 28 overlap with each other in the output connection terminals 16, no conventional interconnects need not be formed. This allows the electro-optical device 1 to have low wiring resistance and also allows the driver IC 19 to have a reduced size.

Figure 13:
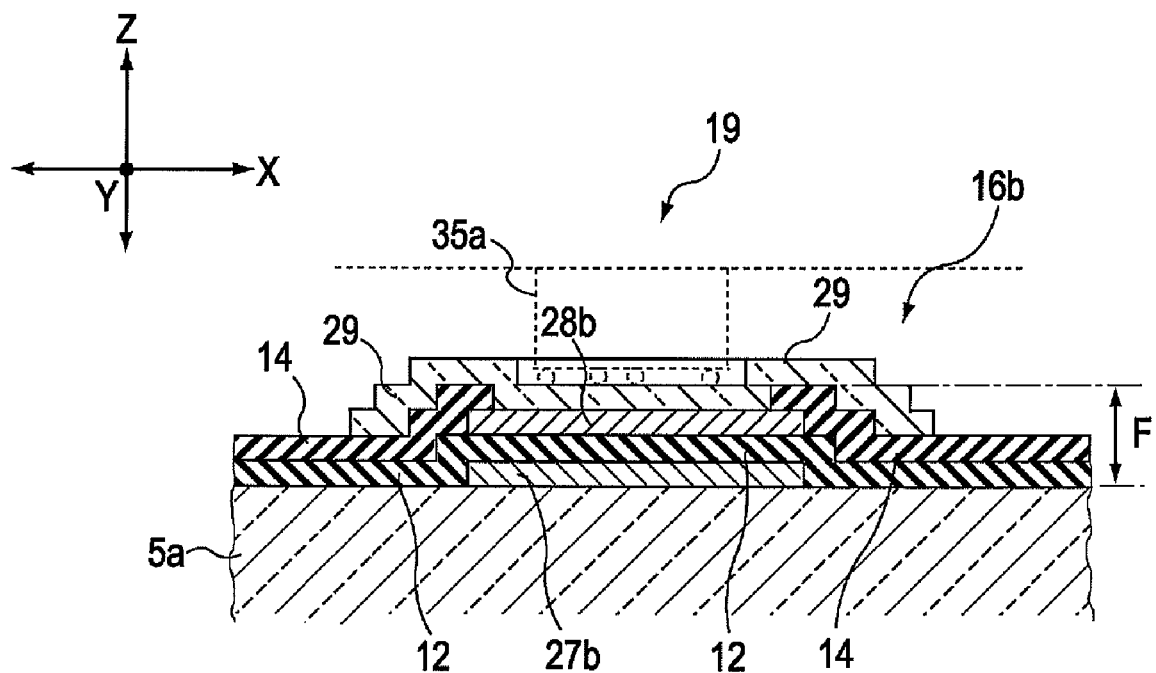
FIG. 13 is a sectional view of a source output connection terminal disposed in an electro-optical device that is a modification of the electro-optical device according to the first embodiment.

FIG. 13 shows a source output connection terminal 16b disposed in an electro-optical device that is a modification of the electro-optical device 1 of this embodiment. In this output connection terminal 16, as shown in FIG. 13, a transparent electrode 29 that is outermost need not be connected to a first source metal layer 27b but may be electrically connected to a second source metal layer 28b. In this case, this first source metal layer 27b may be completely covered with a first insulating layer 12 and therefore no openings need to be formed in this first insulating layer 12. This reduces the number of manufacturing steps to reduce manufacturing cost. In order to achieve high electrical reliability, this first source metal layer 27b is preferably electrically connected to this second source metal layer 28b with this transparent electrode 29.

The contact sections 30 have the hollow zones 44, which have the first hollow regions 31 present in that first insulating layer 12 and the second hollow regions 33a, present in the second insulating layer 14, overlapping with the first hollow regions 31. The transparent electrodes 29 extend over the second metal layers 28 and the first metal layers 27 exposed through the first and second hollow regions 31 and 33a.

Therefore, the first metal layers 27 can be securely electrically connected to the second metal layers 28 with the transparent electrodes 29.

Since the first and second hollow regions 31 and 33a overlap with each other, the first metal layers 27 can be electrically connected to the second metal layers 28 with the transparent electrodes 29 at the shortest distance. This leads to a reduction in resistance.

In the step of forming the output connection terminals 16, that first insulating layer 12 is exposed using the second metal layers 28 as exposure masks, developed, and then etched together with the second insulating layer 14, whereby the output connection terminals 16 are formed. This reduces the number of manufacturing steps to reduce manufacturing cost.

If the openings 32 have been formed in the second metal layers 28 in advance, the second insulating layer 14 overlying the second metal layers 28 is exposed and then developed, whereby the second hollow regions 33a are formed near the openings 32. The first hollow regions 31 may be formed in that first insulating layer 12 so as to overlap with the second hollow regions 33a. In this case, the second metal layers 28 can be used as masks and therefore precise exposure and development can be performed. This leads to a reduction in manufacturing cost.

Second Embodiment

An electro-optical device according to a second embodiment of the present invention will now be described. The electro-optical device of this embodiment is different from that of the first embodiment in that contact sections are not disposed on center portions of first metal layers but are disposed on end portions of the first metal layers. Components common to those described in the first embodiment have the same reference numerals and will not be described in detail. A method for manufacturing the electro-optical device of this embodiment is substantially the same as that for manufacturing the electro-optical device 1 of the first embodiment and will not be described in detail.

Figure 14:
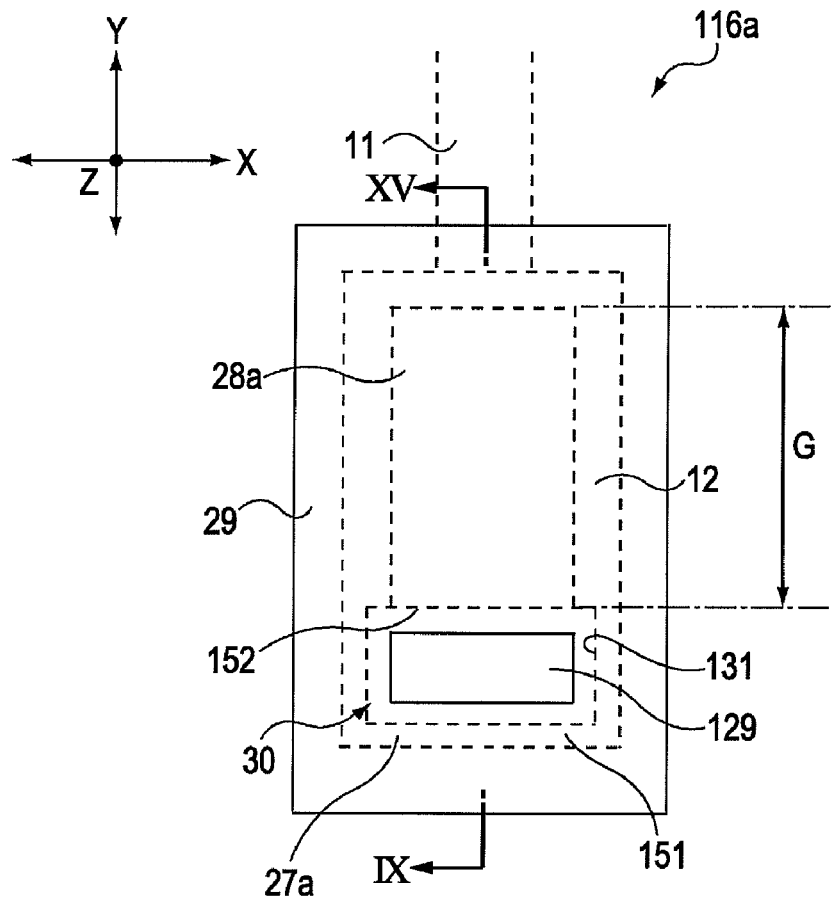
FIG. 14 is a plan view of a gate output connection terminal disposed in an electro-optical device according to a second embodiment of the present invention.
Figure 15:
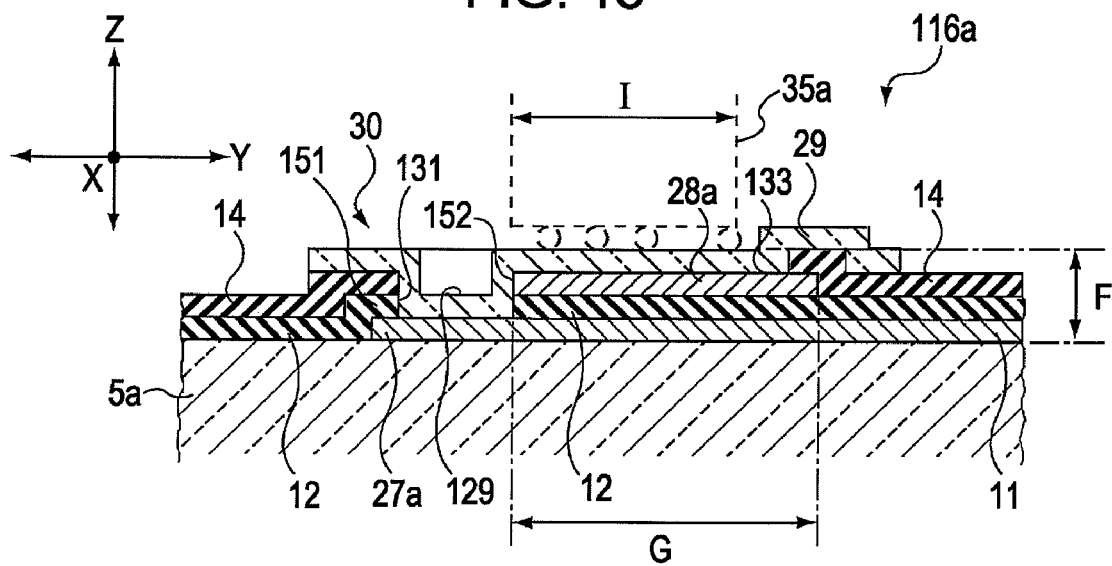
FIG. 15 is a sectional view of the gate output connection terminal taken along the line XV-XV of FIG. 14.
Figure 16:
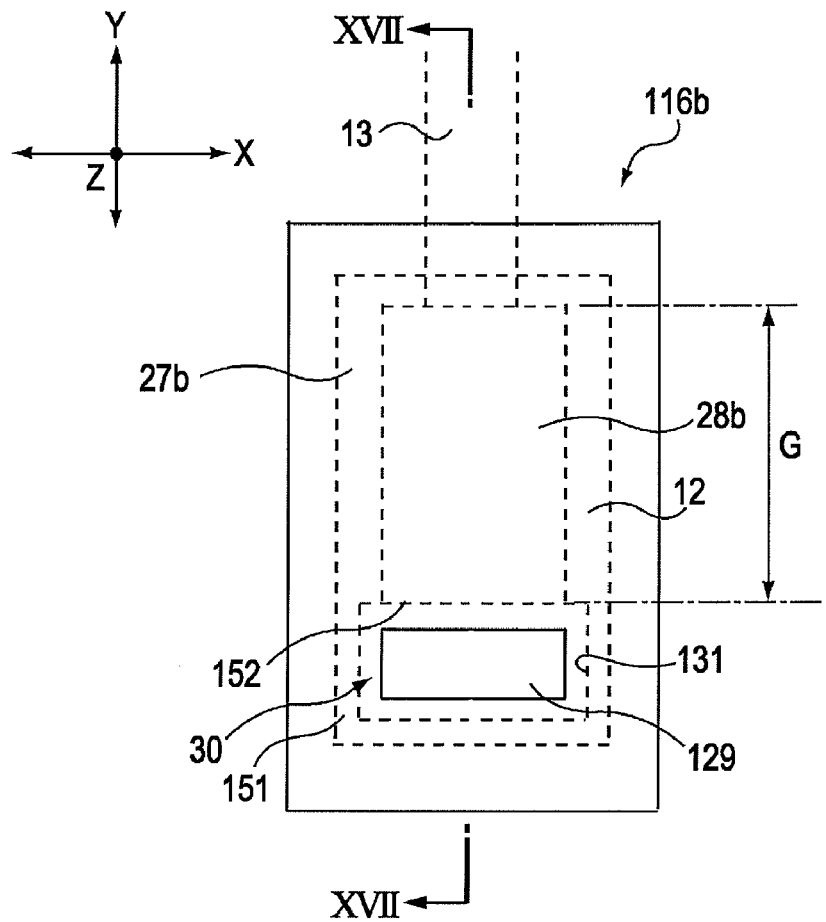
FIG. 16 is a plan view of a source output connection terminal disposed in the electro-optical device according to the second embodiment.
Figure 17:
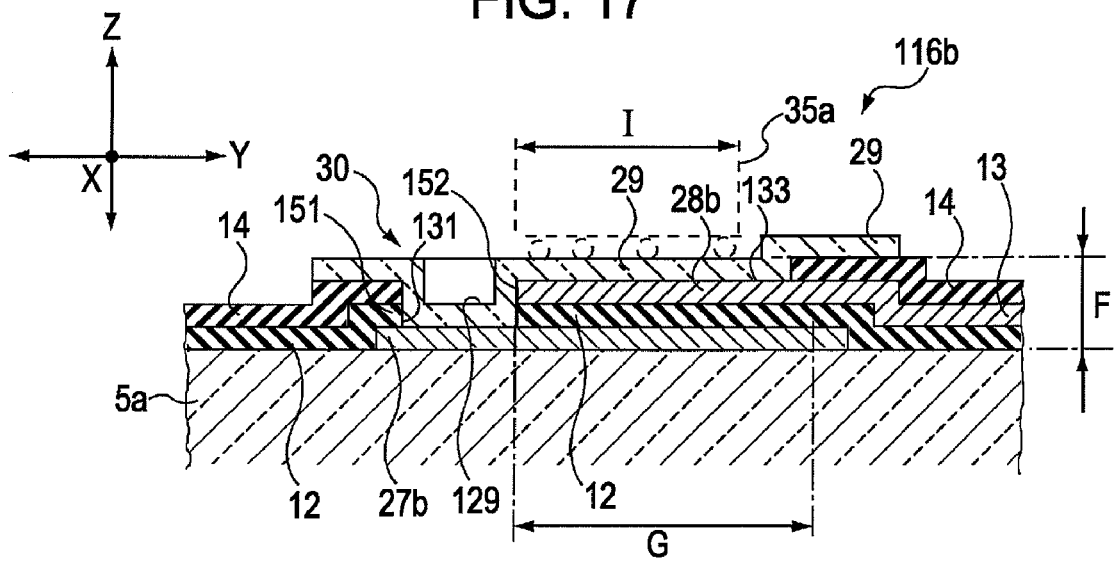
FIG. 17 is a sectional view of the source output connection terminal taken along the line XVII-XVII of FIG. 16.

FIG. 14 shows one of gate output connection terminals 116a disposed in the electro-optical device in plan view. FIG. 15 shows the gate output connection terminal 116a in sectional view taken along the line XV-XV of FIG. 14. FIG. 16 shows one of source output connection terminals 116b disposed in the electro-optical device in plan view. FIG. 17 shows the source output connection terminal 116b in sectional view taken along the line XVII-XVII of FIG. 16.

With reference to FIGS. 14 and 15, the gate output connection terminals 116a each include a first gate metal layer 27a. The first gate metal layer 27a is disposed on a first base member 5a so as to be located in a mount region C, has substantially a rectangular shape, and is connected to a side (the lower side) of one of gate lines 11 having a rectangular shape as shown in FIG. 14. With reference to FIG. 15, the gate line 11 and the first gate metal layer 27a are not separately shown because the gate line 11 and the first gate metal layer 27a are connected to each other and are made of the same metal.

The gate output connection terminals 116a each include a portion of a first insulating layer 12 overlying the first gate metal layer 27a. The first insulating layer 12 has third hollow regions 131 which have substantially a rectangular shape and which are smaller than the first gate metal layer 27a. With reference to FIG. 14, the first gate metal layer 27a has an end portion 151 located in the longitudinal direction of the first gate metal layer 27a (in the Y direction in FIG. 14). The third hollow regions 131 are each located on the end portion 151 of each first gate metal layer 27a. The end portion 151 of the first gate metal layer 27a is located on the side opposite to the gate line 11 located on the leading side of the first gate metal layer 27a as shown in FIG. 14.

The gate output connection terminals 116a each further include a second gate metal layer 28a disposed on the first insulating layer 12. With reference to FIGS. 14 and 15, the second gate metal layer 28a is located on the inner side of the first gate metal layer 27a, overlaps with the first gate metal layer 27a in plan view, and has substantially a rectangular shape.

The second gate metal layer 28a has a first side 152 which is located on the side opposite to the leading side of the first gate metal layer 27a and which substantially overlaps with a second side of the third hollow region 131 that is located on the leading side of the first gate metal layer 27a as shown in FIG. 14.

That is, the second gate metal layer 28a entirely overlaps with the first gate metal layer 27a in plan view with the first gate metal layer 27a and first insulating layer 12 sandwiched between the first base member 5a and the second gate metal layer 28a as shown in FIGS. 14 and 15. The first side 152 of the second gate metal layer 28a substantially agrees with the second side of the third hollow region 131.

The gate output connection terminals 116a each further include a portion of a second insulating layer 14 that overlies the first insulating layer 12 so as to cover an end portion of the second gate metal layer 28a that is located close to the gate line 11 as shown in FIG. 15. The second gate metal layer 28a has an exposed portion 133 exposed from the second insulating layer 14.

The gate output connection terminals 116a each further include a transparent electrode 29 that extends on the second insulating layer 14 to cover the first gate metal layer 27a exposed through the third hollow region 131, the first side 152 and exposed portion 133 of the second gate metal layer 28a, and portions around the third hollow region 131.

This allows a contact section 30 to be located in the end portion 151 of each gate output connection terminal 116a. In the contact section 30, the first gate metal layer 27a exposed from the first insulating layer 12 is electrically connected to the second gate metal layer 28a with the transparent electrode 29.

The electro-optical device includes a driver IC 19 including bump sections 35 having output bumps 35a. Each output bump 35a is electrically connected to a surface of each transparent electrode 29 with, for example, conductive particles 36. With reference to FIG. 15, the elevation from the upper surface of the first base member 5a to the surface of the transparent electrode 29 that is electrically connected to the output bump 35a is equal to the sum of the thickness of the first gate metal layer 27a, that of the first insulating layer 12, that of the second gate metal layer 28a, and that of the second insulating layer 14, the sum of the thicknesses of these layers being represented by F.

With reference to FIGS. 14 and 15, the gate output connection terminals 116a each has an overlapping region G where the first gate metal layer 27a overlaps with the second gate metal layer 28a in plan view. The output bump 35a has an end surface facing the transparent electrode 29. The end surface of each output bump 35a overlaps with the overlapping region G.

With reference to FIGS. 14 and 15, the transparent electrode 29 has a recess 129 extending into one of the third hollow regions 131. The recess 129 corresponds to the contact section 30.

In particular, the output bump 35*a* is electrically connected to a portion of the transparent electrode 29 that is disposed on the exposed portion 133 with the conductive particles 36. With reference to FIG. 15, the output bump 35*a* is located outside the recess 129 and has an end surface facing the transparent electrode 29. The end surface of the output bump 35*a* substantially entirely overlaps with the overlapping region G, the end surface thereof being represented by I in FIGS. 14 and 15.

The third hollow regions 131 are rectangular as described above and may be, for example, circular. The number of the third hollow regions 131 present in the gate output connection terminals 116*a* is not limited to one.

The source output connection terminals 116*b* are similar to the gate output connection terminals 116*a* but are different from the gate electrode 116 in that the source output connection terminals 116*b* are connected to source lines 13 although the gate output connection terminals 116*a* are connected to the gate lines 11.

With reference to FIGS. 16 and 17, the source output connection terminals 116*b* each include a first source metal layer 27*b*. The first source metal layer 27*b* is disposed on the first base member 5*a* so as to be located in the mount region C, has substantially a rectangular shape, and is not connected to any gate lines 11.

The source output connection terminals 116*b* each further include a portion of the first insulating layer 12 that extends over the first base member 5*a* so as to cover the first source metal layer 27*b*. The first insulating layer 12 has third hollow regions 131 which have substantially a rectangular shape and which are smaller than the first gate metal layer 27*a*. With reference to FIGS. 16 and 17, the first source metal layer 27*b* has an end portion 151 located in the longitudinal direction of the first source metal layer 27*b* (in the Y direction in FIG. 16). Each third hollow region 131 is located on the end portion 151 of each first source metal layer 27*b*.

The source output connection terminals 116*b* each further include a second source metal layer 28*b*. With reference to FIGS. 16 and 17, the second source metal layer 28*b* is located on the inner side of the first source metal layer 27*b*, overlaps with the first source metal layer 27*b*, has substantially a rectangular shape, and is disposed on the first insulating layer 12. The upper side of the second source metal layer 28*b* is connected to one of the source lines 13. The second source metal layer 28*b* and each source line 13 are not separately shown in FIG. 16 because the second source metal layer 28*b* and the source line 13 (a source electrode 23) are made of the same metal and are connected to each other.

The second source metal layer 28*b* has a first side 152. The first side 152 of the second source metal layer 28*b* is located on the side opposite to the leading side of the source line 13 and substantially overlaps with a second side of the third hollow region 131 that is located on the leading side of the source line 13 as shown in FIG. 16.

That is, the second source metal layer 28*b* entirely overlaps with the first source metal layer 27*b* in plan view with the first source metal layer 27*b* and first insulating layer 12 sandwiched between the first base member 5*a* and the second source metal layer 28*b* as shown in FIGS. 16 and 17. The first side 152 of the second source metal layer 28*b* substantially agrees with the second side of the third hollow region 131.

The source output connection terminals 116*b* each further include a portion of the second insulating layer 14. The second insulating layer 14 extends on the first insulating layer 12 to cover an end portion of the second source metal layer 28*b* that is located close to the source line 13 as shown in FIG. 17.

The second source metal layer 28*b* has an exposed portion 133 exposed from the second insulating layer 14.

The source output connection terminals 116*b* each further include a transparent electrode 29 that extends on the second insulating layer 14 to cover the first gate metal layer 27*a* exposed through the third hollow region 131, the first side 152 and exposed portion 133 of the second source metal layer 28*b*, and portions around the third hollow region 131.

This allows a contact section 30 to be located in the end portion 151 of each source output connection terminal 116*b*. In the contact section 30, the first source metal layer 27*b* exposed from the first insulating layer 12 is electrically connected to the second source metal layer 28*b* with the transparent electrode 29.

With reference to FIG. 17, the elevation from the upper surface of the first base member 5*a* to the surface of the transparent electrode 29 that is electrically connected to the output bump 35*a* is equal to the sum of the thickness of the first source metal layer 27*b*, that of the first insulating layer 12, that of the second source metal layer 28*b*, and that of the second insulating layer 14, the sum of the thicknesses of these layers being represented by F. Therefore, the height of each of the gate and source output connection terminals 116*a* and 116*b* is equal to the elevation from the upper surface of the first base member 5*a* to the lower surface of the transparent electrode 29. This improves the reliability of the electrical connection of the gate and source output connection terminals 116*a* and 116*b* to the output bumps 35*a*.

With reference to FIGS. 16 and 17, the source output connection terminals 116*b* each further have an overlapping region G where the first source metal layer 27*b* overlaps with the second source metal layer 28*b* in plan view. The end surface of each output bump 35*a* overlaps with the overlapping region G.

With reference to FIGS. 16 and 17, the transparent electrodes 29 each have a recess 129 extending into one of the third hollow regions 131. The recess 129 corresponds to the contact section 30.

In particular, the output bump 35*a* is electrically connected to a portion of the transparent electrode 29 that is disposed on the exposed portion 133 with the conductive particles and is located outside the recess 129 as shown in FIG. 17. Therefore, the end surface of the output bump 35*a* substantially entirely overlaps with the overlapping region G, the end surface thereof being represented by I in FIGS. 16 and 17.

According to the electro-optical device of this embodiment, the contact sections 30 are located in the end portions 151 located on the side opposite to the leading side of the gate or source output connection terminals 116*a* or 116*b*; hence, the gate and source output connection terminals 116*a* and 116*b* have a reduced width. This allows the gate and source output connection terminals 116*a* and 116*b* to be arranged at a reduced pitch.

Since the contact sections 30 are located in the end portions 151, the end surfaces of the output bumps 35*a* that face the transparent electrodes 29 can be brought into contact with the overlapping regions G where the first gate metal layers 27*a* or the first source metal layers 27*b* overlap with the second gate metal layers 28*a* or the second source metal layer 28*b*, respectively, in plan view. This leads to a reduction in electrical resistance and an increase in electrical reliability.

The first insulating layer 12 has the third hollow regions 131, through which the first metal layers 27 are exposed, and the second metal layers 28 do not overlap with the first metal layers 27 in plan view. Hence, the first gate metal layers 27*a* and the first source metal layers 27*b* can be securely electrically connected to the second gate metal layers 28*a* and the second source metal layer 28b, respectively, and the second metal layers 28 can be used as masks when the third hollow regions 131 are formed by exposure or another technique.

Third Embodiment

An electro-optical device according to a third embodiment of the present invention will now be described. The electro-optical device of this embodiment is different from that of the first embodiment in that contact sections are not disposed on center portions of first metal layers disposed in output connection terminals but are disposed on end portions of the first metal layers that are located on the leading side of the first metal layers.

Figure 18:
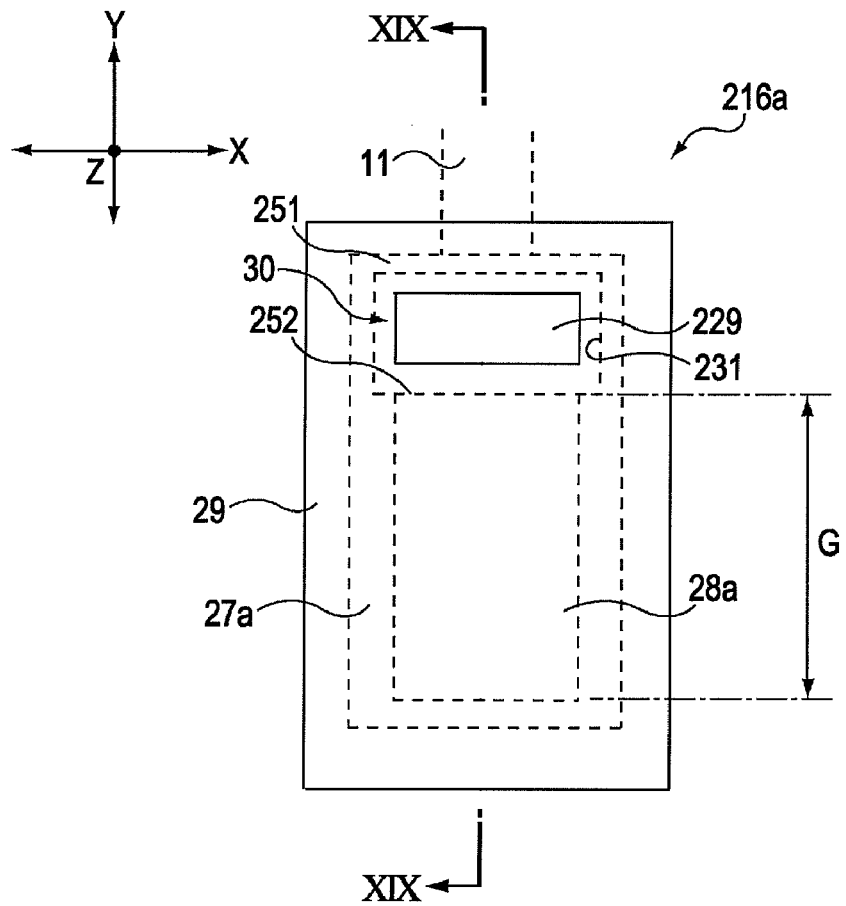
FIG. 18 is a plan view of a gate output connection terminal disposed in an electro-optical device according to a third embodiment of the present invention.
Figure 19:
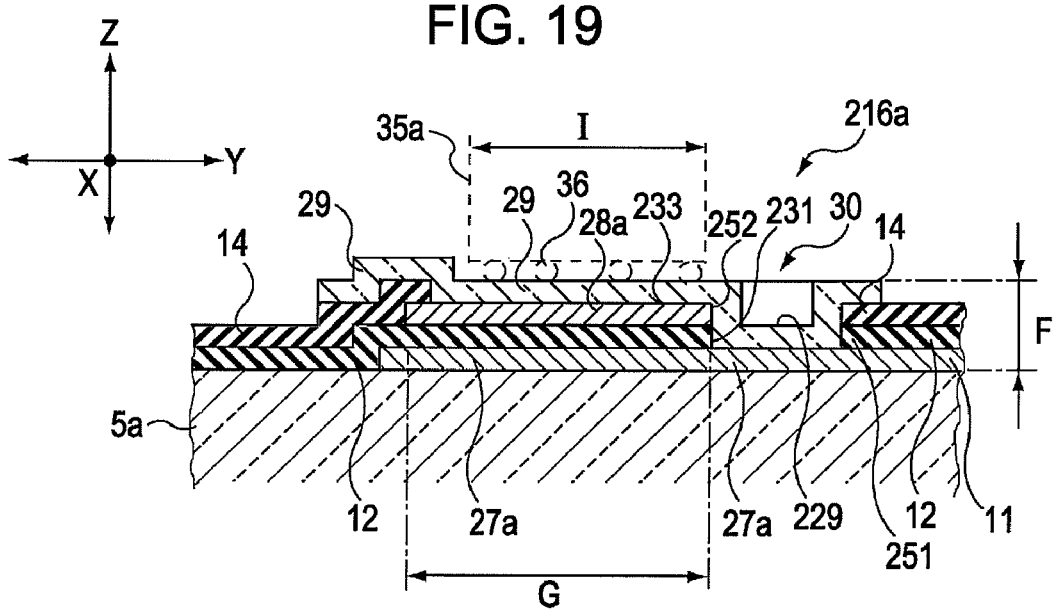
FIG. 19 is a sectional view of the gate output connection terminal taken along the line XIX-XIX of FIG. 18.

FIG. 18 shows one of gate output connection terminals 216a disposed in the electro-optical device in plan view. FIG. 19 shows the gate output connection terminal 216a in sectional view taken along the line XIX-XIX of FIG. 18.

With reference to FIGS. 18 and 19, the gate output connection terminals 216a each include a first gate metal layer 27a which is disposed on a first base member 5a so as to be located in a mount region C and which has substantially a rectangular shape. The first gate metal layer 27a is connected to a side (the lower side) of one of gate lines 11 having a rectangular shape as shown in FIG. 18. With reference to FIG. 19, each gate line 11 and the first gate metal layer 27a are not separately shown because the gate line 11 and the first gate metal layer 27a are connected to each other and are made of the same metal.

With reference to FIGS. 18 and 19, the gate output connection terminals 216a each further include a portion of a first insulating layer 12 overlying the first gate metal layer 27a. With reference to FIG. 18, the first insulating layer 12 has third hollow regions 231 with substantially a rectangular shape. The first gate metal layer 27a has an end portion 251 located in the longitudinal direction of the first gate metal layer 27a (in the Y direction in FIG. 18). Each third hollow region 231 is located on each end portion 251 and is smaller than the first gate metal layer 27a. The end portion 251 is located on the leading side of the first gate metal layer 27a connected to the gate line 11 as shown in FIG. 18.

The gate output connection terminals 216a each further include a second gate metal layer 28a disposed on the first insulating layer 12. The second gate metal layer 28a is located on the inner side of the first gate metal layer 27a, overlaps with the first gate metal layer 27a in plan view, and has substantially a rectangular shape as shown in FIGS. 18 and 19.

The second gate metal layer 28a has a first side 252 which is located on the leading side of the first gate metal layer 27a and which substantially overlaps with a second side of the third hollow region 231 that is located on the leading side of the first gate metal layer 27a as shown in FIG. 19.

That is, the second gate metal layer 28a entirely overlaps with the first gate metal layer 27a in plan view with the first gate metal layer 27a and first insulating layer 12 sandwiched between the first base member 5a and the second gate metal layer 28a as shown in FIGS. 18 and 19. The first side 252 of the second gate metal layer 28a substantially agrees with the second side of the third hollow region 231.

The gate output connection terminals 216a each further include a portion of a second insulating layer 14 that overlies the first insulating layer 12 so as to cover an end portion of the second gate metal layer 28a that is located on the side opposite to the gate line 11 as shown in FIGS. 18 and 19. The second gate metal layer 28a has an exposed portion 233 exposed from the second insulating layer 14. The first side 252 of the second gate metal layer 28a is also exposed from the second insulating layer 14.

The gate output connection terminals 216a each further include a transparent electrode 29 that extends on the second insulating layer 14 to cover the first gate metal layer 27a exposed through the third hollow region 231, the first side 252 and exposed portion 233 of the second gate metal layer 28a, and portions around the third hollow region 231.

This allows a contact section 30 to be located in the end portion 151 of each gate output connection terminal 216a. In the contact section 30, the first gate metal layer 27a exposed from the first insulating layer 12 is electrically connected to the second gate metal layer 28a with the transparent electrode 29.

The electro-optical device includes a driver IC 19 including bump sections 35 having output bumps 35a. Each output bump 35a is electrically connected to a surface of each transparent electrode 29 with, for example, conductive particles 36. With reference to FIG. 19, the elevation from the upper surface of the first base member 5a to the surface of the transparent electrode 29 that is electrically connected to the output bump 35a is equal to the sum of the thickness of the first gate metal layer 27a, that of the first insulating layer 12, that of the second gate metal layer 28a, and that of the second insulating layer 14, the sum of the thicknesses of these layers being represented by F.

With reference to FIGS. 18 and 19, the gate output connection terminals 216a each has an overlapping region G where the first gate metal layer 27a overlaps with the second gate metal layer 28a in plan view. The output bump 35a has an end surface facing the transparent electrode 29. The end surface of the output bump 35a overlaps with the overlapping region G.

The transparent electrode 29 has a recess 229 extending into the third hollow region 231 as shown in FIGS. 18 and 19. The recess 229 corresponds to the contact section 30.

In particular, the output bump 35a is electrically connected to a portion of the transparent electrode 29 that is disposed on the exposed portion 233 with the conductive particles 36. With reference to FIG. 19, the output bump 35a is located outside the recess 229 and has an end surface facing the transparent electrode 29. The end surface of the output bump 35a substantially entirely overlaps with the overlapping region G as shown in FIGS. 18 and 19.

The third hollow regions 231 are rectangular as described above and may be, for example, circular. The number of the third hollow regions 231 present in the gate output connection terminals 216a is not limited to one.

According to the electro-optical device of this embodiment, the end portions 251 are located on the leading side of the gate output connection terminals 216a; hence, portions of the first gate metal layers 27a that are located most close to the gate lines 11 can be electrically connected to the second gate metal layers 28a with the transparent electrodes 29. This reduces the resistance of the electrical connections between the transparent electrodes 29 and the output bumps 35a to enhance the electrical reliability of the electro-optical device.

Fourth Embodiment

An electro-optical device according to a fourth embodiment of the present invention will now be described. The electro-optical device of this embodiment is different from that of the first embodiment in that contact sections are not disposed on center portions of first metal layers disposed in output connection terminals but are disposed on end portions of the first metal layers that are located on the leading side of the first metal layers or located on the side opposite to the leading side thereof.

Figure 20:
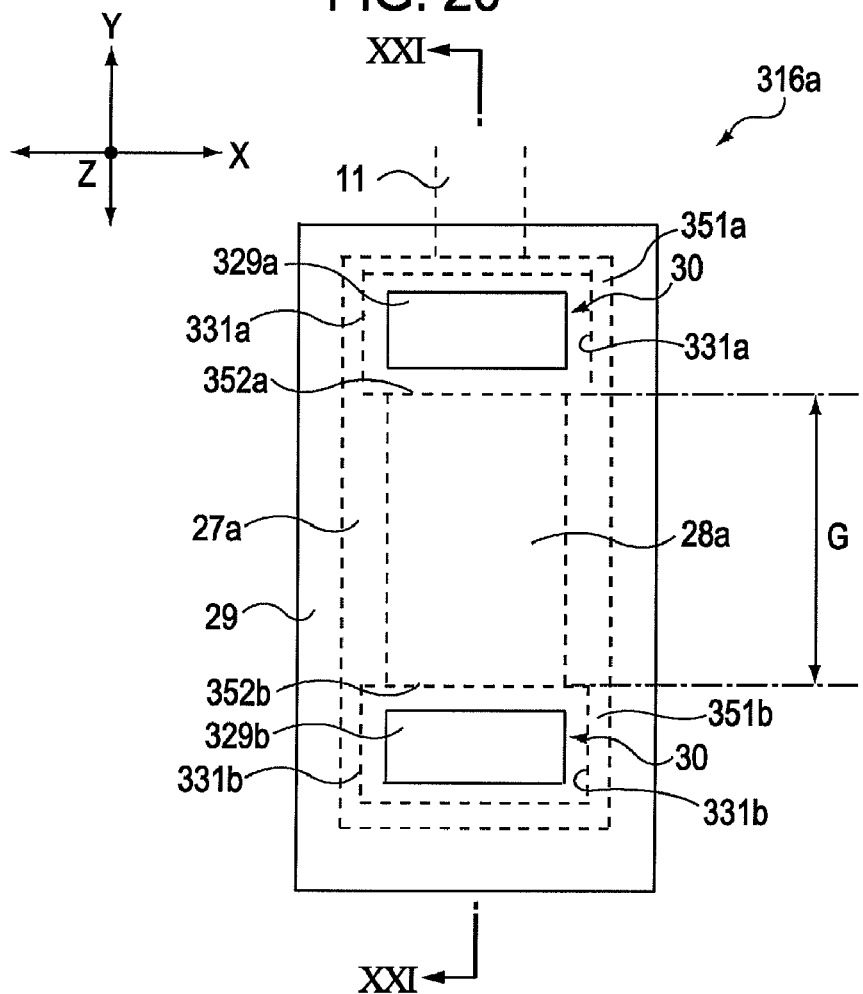
FIG. 20 is a plan view of a gate output connection terminal disposed in an electro-optical device according to a fourth embodiment of the present invention.
Figure 21:
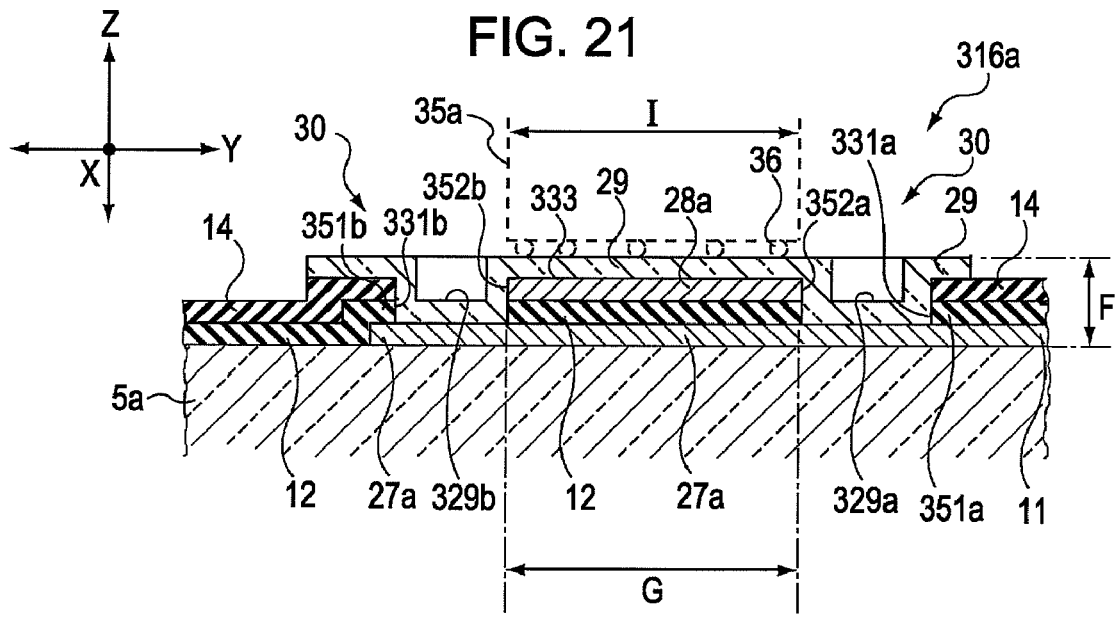
FIG. 21 is a sectional view of the gate output connection terminal taken along the line XXI-XXI of FIG. 20.

FIG. 20 shows one of gate output connection terminals 316a disposed in the electro-optical device in plan view. FIG. 21 shows the gate output connection terminal 316a in sectional view taken along the line XXI-XXI of FIG. 20.

With reference to FIGS. 20 and 21, the gate output connection terminals 316a each include a first gate metal layer 27a which is disposed on a first base member 5a so as to be located in a mount region C and which has substantially a rectangular shape. The first gate metal layer 27a is connected to a side (the lower side) of one of gate lines 11 having a rectangular shape as shown in FIG. 20. With reference to FIG. 21, each gate line 11 and the first gate metal layer 27a are not separately shown because the gate line 11 and the first gate metal layer 27a are connected to each other and are made of the same metal.

The gate output connection terminals 316a each further include a portion of a first insulating layer 12 overlying the first gate metal layer 27a. With reference to FIG. 20, the first insulating layer 12 has third leading-side hollow regions 331a and third opposite-side hollow regions 331b having substantially a rectangular shape. The first gate metal layer 27a has a first end portion 351a and second end portion 351b located in the longitudinal direction of the first gate metal layer 27a (in the Y direction in FIG. 18). The third leading-side hollow regions 331a and the third opposite-side hollow regions 331b are smaller than the first and second end portions 351a and 351b. Each third leading-side hollow region 331a is disposed on each first end portion 351a and each third opposite-side hollow region 331b is disposed on each second end portion 351b. The first end portion 351a is located on the leading side of the first gate metal layer 27a connected to the gate line 11 and the second end portion 351b is located on the side opposite to the leading side of the first gate metal layer 27a as shown in FIG. 20.

The gate output connection terminals 316a each further include a second gate metal layer 28a disposed on the first insulating layer 12. The second gate metal layer 28a is located on the inner side of the first gate metal layer 27a, overlaps with the first gate metal layer 27a in plan view, and has substantially a rectangular shape as shown in FIGS. 20 and 21.

With reference to FIG. 21, the second gate metal layer 28a has a first side 352a which is located on the leading side of the first gate metal layer 27a and which substantially overlaps with a third side of the third leading-side hollow region 331a that is located on the side opposite to the leading side of the first gate metal layer 27a. Furthermore, the second gate metal layer 28a has a second side 352b which is located on the side opposite to the leading side of the first gate metal layer 27a and which substantially overlaps with a fourth side of the third opposite-side hollow region 331b that is located on the leading side of the first gate metal layer 27a.

That is, the second gate metal layer 28a entirely overlaps with the first gate metal layer 27a in plan view with the first gate metal layer 27a and first insulating layer 12 sandwiched between the first base member 5a and the second gate metal layer 28a as shown in FIGS. 20 and 21. The first side 352a of the second gate metal layer 28a substantially agrees with the third side of the third leading-side hollow region 331a and the second side 352b of the second gate metal layer 28a substantially agrees with the fourth side of the third opposite-side hollow region 331b.

With reference to FIG. 21, the gate output connection terminals 316a each further include a portion of a second insulating layer 14 overlying the first insulating layer 12. The second gate metal layer 28a has an exposed portion 333 exposed from the second insulating layer 14. The first and second sides 352a and 352b of the second gate metal layer 28a are also exposed from the second insulating layer 14. The exposed portion 333 is located between the third leading-side hollow region 331 and the third opposite-side hollow region 331b.

The gate output connection terminals 316a each further include a transparent electrode 29 that extends on the second insulating layer 14 to cover a portion of the first gate metal layer 27a that is exposed through the third leading-side hollow region 331a and the third opposite-side hollow region 331b, the first and second sides 352a and 352b and exposed portion 333 of the second gate metal layer 28a, portions around the third leading-side hollow region 331a, and portions around the third opposite-side hollow region 331b.

This allows contact sections 30 to be each located in the first end portion 351a or second end portion 351b of each gate output connection terminal 316a. In each contact section 30, the first gate metal layer 27a exposed from the first insulating layer 12 is electrically connected to the second gate metal layer 28a with the transparent electrode 29.

The electro-optical device includes a driver IC 19 including bump sections 35 having output bumps 35a. Each output bump 35a is electrically connected to a surface of each transparent electrode 29 with, for example, conductive particles 36. With reference to FIG. 21, the elevation from the upper surface of the first base member 5a to the surface of the transparent electrode 29 that is electrically connected to the output bump 35a is equal to the sum of the thickness of the first gate metal layer 27a, that of the first insulating layer 12, that of the second gate metal layer 28a, and that of the second insulating layer 14, the sum of the thicknesses of these layers being represented by F.

With reference to FIGS. 18 and 19, the gate output connection terminals 316a each has an overlapping region G where the first gate metal layer 27a overlaps with the second gate metal layer 28a in plan view. The output bump 35a has an end surface facing the transparent electrode 29. The end surface of the output bump 35a overlaps with the overlapping region G, the end surface thereof being represented by I in FIGS. 20 and 21.

The transparent electrode 29 has a first recess 329a extending into the third leading-side hollow region 331a and a second recess 329b extending into the third opposite-side hollow region 331b as shown in FIGS. 20 and 21. The first and second recesses 329a and 329b correspond to the contact sections 30.

In particular, the output bump 35a is electrically connected to a portion of the transparent electrode 29 that is disposed on the exposed portion 333 with the conductive particles 36. With reference to FIG. 21, the output bump 35a is located outside the first or second recess 329a or 329b and has an end surface facing the transparent electrode 29. The end surface of the output bump 35a substantially entirely overlaps with the overlapping region G as shown in FIGS. 20 and 21, the end surface thereof being represented by I in FIG. 21.

The third leading-side hollow regions 331a and the third opposite-side hollow regions 331b are rectangular as described above and may be, for example, circular. The number of the third leading-side hollow regions 331a and third opposite-side hollow regions 331b present in the gate output connection terminals 316a is not limited to one.

The end surface of the output bump 35a is entirely in contact with the transparent electrode 29 disposed on the exposed portion 333 as described above and may be partly in contact with the overlapping region G. The end surface thereof is preferably entirely in contact with the transparent electrode 29 because of low electrical resistance.

According to the electro-optical device of this embodiment, the contact sections 30 are each located in the first and second end portions 351a and 351b of the gate output connection terminals 316a. This allows the gate output connection terminals 316a to have a reduced width and to be arranged at a reduced pitch.

Since the contact sections 30 are each located in the first and second end portions 351a and 351b thereof, the contact area between each first gate metal layer 27a and transparent electrode 29 is large. This leads to an increase in connection reliability.

If one of the contact sections 30 each located in the first and second end portions 351a and 351b thereof is electrically broken, the other one is still usable. This also leads to an increase in connection reliability.

Fifth Embodiment

An electronic apparatus according to a fifth embodiment of the present invention will now be described. The electronic apparatus includes any one of the above electro-optical devices.

Figure 22:
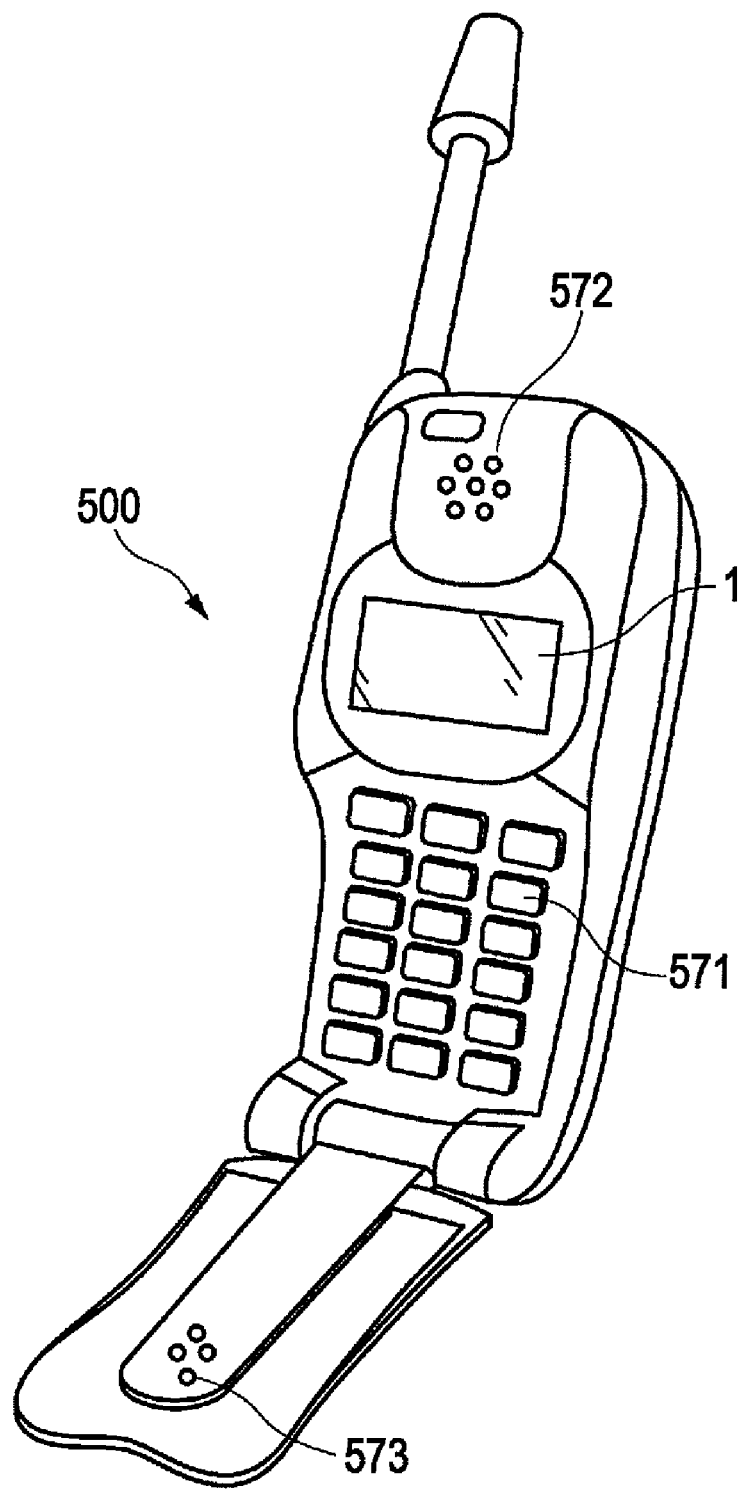
FIG. 22 is a schematic view of a mobile phone that is an example of an electronic apparatus according to a fifth embodiment of the present invention.
Figure 23:
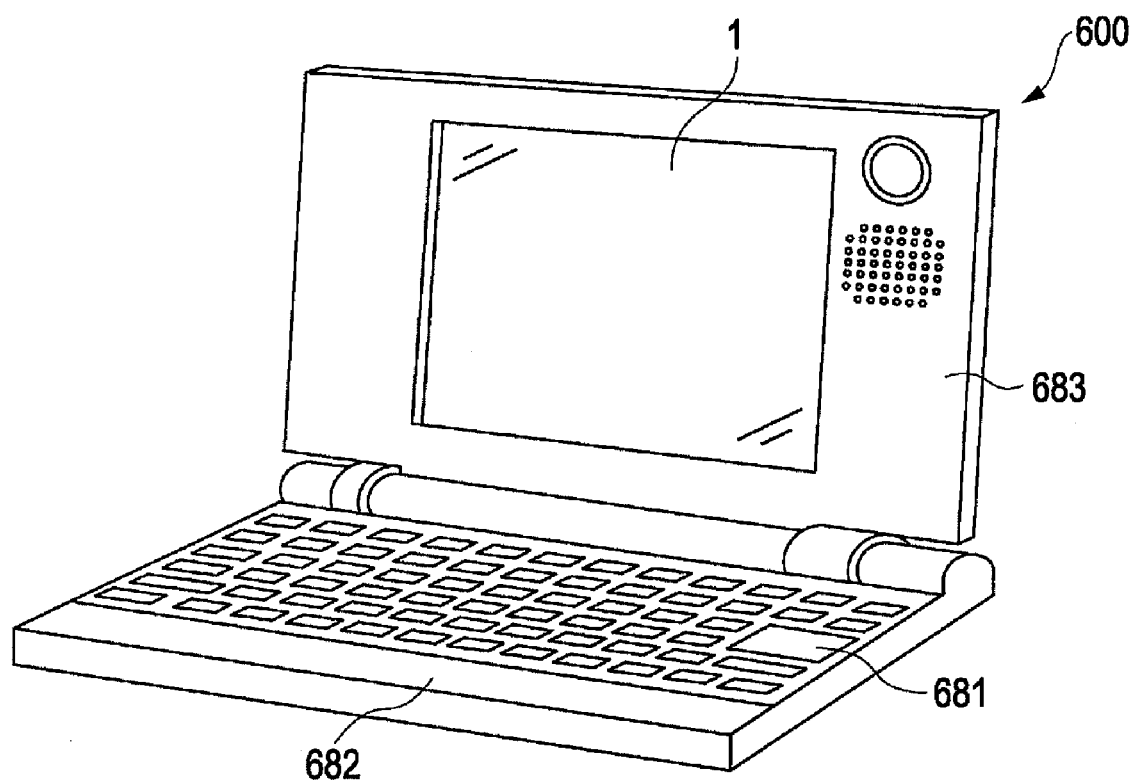
FIG. 23 is a schematic view of a personal computer that is an example of the electronic apparatus according to the fifth embodiment.

FIG. 22 shows a mobile phone 500 that is an example of the electronic apparatus. FIG. 23 shows a personal computer 600 that is another example of the electronic apparatus.

With reference to FIG. 22, the mobile phone 500 includes a plurality of operation buttons 571, a mouthpiece 572, an earpiece 573, and an electro-optical device 1.

With reference to FIG. 23, the personal computer 600 includes a main unit 682 including a keyboard 681 and also includes a liquid crystal display unit 683 including an electro-optical device 1.

The mobile phone 500 and the personal computer 600 may each further include a display information output source; a display signal-generating unit including various circuits, such as display information-processing circuits, and a power supply circuit supplying electric power to the circuits; and the like.

The electro-optical device 1 of the personal computer 600 is supplied with a display signal generated by the display signal-generating unit on the basis of information input from the keyboard 681, whereby an image is displayed on this electro-optical device 1.

According to this embodiment, since the electronic apparatus includes any one of the above electro-optical devices having high electrical reliability, the electronic apparatus is small-sized, has high electrical reliability, and can be manufactured at low cost.

Since the mobile phone 500 and the personal computer 600 need to be small-sized, advantages of the present invention are great.

Examples of the electronic apparatus include touch panels, projectors, liquid crystal televisions, viewfinder-type or direct view-type video tape recorders, car navigation systems, pagers, electronic notebooks, and portable electronic calculators. An electro-optical device according to present invention can be used for display units for these electronic apparatuses.

The present invention is not limited to the above embodiments. Within the scope of the present invention, various modifications may be made or the embodiments may be combined.

The driver ICs 19 described in the embodiments are chip-on-glass (COG) modules. The driver ICs 19 are not limited to the COG modules and may be chip-on-film (COF) modules mountable on flexible boards. This improves the electrical reliability of connection terminals for various electro-optical devices even if the connection terminals and wires are arranged at a reduced pitch.

Examples of an electro-optical device according to the present invention are not limited to liquid crystal devices and may be inorganic or organic electroluminescent devices.

The entire disclosure of Japanese Patent Application No. 2006-186365, filed Jun. 6, 2006 is expressly incorporated by reference herein.

What is claimed is:

1. An electro-optical device comprising:
a substrate having a display region;
a plurality of display thin-film transistors each including
   a first electrode disposed in the display region,
   a portion of a first insulating layer located on the side opposite to the substrate with the first electrode disposed therebetween,
   a second electrode located on the side opposite to the substrate with the first insulating layer disposed therebetween, and
   a second insulating layer located on the side opposite to the substrate with the second electrode disposed therebetween; and
a plurality of connection terminals each including
   a first metal layer which is disposed on a protruding section extending from the display region, which is located at the same level as that of the first electrode, and which is made of the same metal as that of the first electrode,
   a second metal layer which is located at the same level as that of the second electrode, and which is made of the same metal as that of the second electrode, and which partly overlaps with the first metal layer in plan view, and
   a portion of the first insulating layer,
wherein the first insulating layer extends between the first and second metal layers and the first metal layer is electrically connected to the first electrode or the second metal layer is electrically connected to the second electrode.

2. The electro-optical device according to claim 1, wherein the connection terminals each further include a transparent electrode located on the side opposite to the substrate with the second metal layer disposed therebetween and the transparent electrode is electrically connected to at least one of the first and second metal layers.

3. The electro-optical device according to claim 2, wherein the connection terminals each have a contact section in which a portion of the first metal layer that is exposed from the first insulating layer is electrically connected to the second metal layer with the transparent electrode.

4. The electro-optical device according to claim 3, wherein the contact section has a hollow zone having a first hollow region through which the first metal layer is exposed and a second hollow region through which the second metal layer overlying the first metal layer and the first insulating layer is exposed and the transparent electrode extends over the hollow zone.

5. The electro-optical device according to claim 3, wherein the contact section is disposed in an end portion of the connection terminal that is located in the longitudinal direction of the connection terminal.

6. The electro-optical device according to claim 5, wherein the end portion of the connection terminal is located on the leading side of the first or second metal layer.

7. The electro-optical device according to claim 2, further comprising a semiconductor integrated circuit chip which is mounted on the protruding section and which includes a plurality of output bumps arranged on a mount surface of the semiconductor integrated circuit chip, wherein the output bumps each have an end surface facing the transparent electrode and the end surface of each output bump is partly in contact with an overlapping region where the first metal layer overlaps with the second metal layer in plan view.

8. The electro-optical device according to claim 3, wherein the overlapping region has a flat face, the contact section has a flat face parallel to that of the overlapping region, and the flat face of the overlapping region has an area greater than that of the flat face of the contact section.

9. The electro-optical device according to claim 8, wherein the flat face of the overlapping region has an area that is half or more of the area of the end surface of each output bump.

10. A method for manufacturing an electro-optical device including a substrate having a display region, comprising:
   forming a plurality of display thin-film transistors and a plurality of connection terminals, the display thin-film transistors each including a first electrode disposed in the display region, a portion of a first insulating layer located on the side opposite to the substrate with the first electrode disposed therebetween, a second electrode located on the side opposite to the substrate with the first insulating layer disposed therebetween, and a second insulating layer located on the side opposite to the substrate with the second electrode disposed therebetween, the connection terminals each including a first metal layer which is disposed on a protruding section extending from the display region, which is located at the same level as that of the first electrode, and which is made of the same metal as that of the first electrode, a second metal layer which is located at the same level as that of the second electrode, and which is made of the same metal as that of the second electrode, and which partly overlaps with the first metal layer in plan view, and a portion of the first insulating layer; and
   mounting a semiconductor integrated circuit chip, including a plurality of output bumps each electrically connected to the corresponding connection terminals, on the protruding section,
   wherein the first insulating layer extends between the first and second metal layers.

11. The method according to claim 10, wherein the connection terminals are formed in such a manner that the second metal layers are formed by patterning and the first metal layers are exposed using the second metal layers as masks, developed, and then etched.

12. An electronic apparatus comprising the electro-optical device according to any one of claims 1.

* * * * *